(12) United States Patent
Isogai et al.

(10) Patent No.: US 11,002,705 B2
(45) Date of Patent: May 11, 2021

(54) SEMICONDUCTOR ELEMENT, METHOD FOR MANUFACTURING SAME, AND SENSOR IN WHICH SAME IS USED

(71) Applicant: TORAY INDUSTRIES, INC., Tokyo (JP)

(72) Inventors: Kazuki Isogai, Shiga (JP); Seiichiro Murase, Shiga (JP); Hiroji Shimizu, Shiga (JP)

(73) Assignee: TORAY INDUSTRIES, INC., Tokyo (JP)

( * ) Notice: Subject to any disclaimer, the term of this patent is extended or adjusted under 35 U.S.C. 154(b) by 283 days.

(21) Appl. No.: 15/748,819

(22) PCT Filed: Aug. 8, 2016

(86) PCT No.: PCT/JP2016/073288
§ 371 (c)(1),
(2) Date: Jan. 30, 2018

(87) PCT Pub. No.: WO2017/026439
PCT Pub. Date: Feb. 16, 2017

(65) Prior Publication Data
US 2018/0224392 A1 Aug. 9, 2018

(30) Foreign Application Priority Data

Aug. 11, 2015 (JP) .............................. JP2015-158671

(51) Int. Cl.
*G01N 27/414* (2006.01)
*H01L 51/05* (2006.01)
(Continued)

(52) U.S. Cl.
CPC .......... *G01N 27/4145* (2013.01); *B82Y 15/00* (2013.01); *G01N 27/3275* (2013.01);
(Continued)

(58) Field of Classification Search
CPC .......... G01N 27/4145; G01N 27/3275; G01N 27/3278; G01N 27/414; B82Y 15/00;
(Continued)

(56) References Cited

U.S. PATENT DOCUMENTS 7,935,989 B2    5/2011  Matsumoto et al.
2005/0137330 A1  6/2005  Forshey et al.
(Continued)

FOREIGN PATENT DOCUMENTS

CN    1894321 A   1/2007
CN  101484978 A   7/2009
(Continued)

OTHER PUBLICATIONS

Chinese Office Action and Search Report for Chinese Application No. 201680046302.X, dated May 8, 2019, with English translation.
(Continued)

*Primary Examiner* — Matthew D Krcha
*Assistant Examiner* — Jacqueline Brazin
(74) *Attorney, Agent, or Firm* — Birch, Stewart, Kolasch & Birch, LLP

(57) ABSTRACT

The present invention is to provide a semiconductor element achieving a high-level detection sensitivity when utilized as a sensor. The present invention relates to a semiconductor element including an organic film, a first electrode, a second electrode, and a semiconductor layer, in which the first electrode, the second electrode and the semiconductor layer are formed on the organic film, the semiconductor layer is arranged between the first electrode and the second electrode, the semiconductor layer contains a carbon nanotube, and the organic film has a water contact angle of 5° or more and 50° or less.

21 Claims, 3 Drawing Sheets

(51) Int. Cl.
*H01L 51/00* (2006.01)
*H01L 29/786* (2006.01)
*B82Y 15/00* (2011.01)
*G01N 27/327* (2006.01)
*G01N 27/12* (2006.01)
*B82Y 30/00* (2011.01)

(52) U.S. Cl.
CPC ....... *G01N 27/3278* (2013.01); *G01N 27/414* (2013.01); *H01L 29/786* (2013.01); *H01L 51/0003* (2013.01); *H01L 51/05* (2013.01); *H01L 51/0545* (2013.01); *B82Y 30/00* (2013.01); *G01N 27/126* (2013.01); *G01N 27/4146* (2013.01); *H01L 51/004* (2013.01); *H01L 51/0036* (2013.01); *H01L 51/0048* (2013.01); *H01L 51/0049* (2013.01); *H01L 51/0094* (2013.01)

(58) Field of Classification Search
CPC ... H01L 29/786; H01L 51/0003; H01L 51/05; H01L 51/0545
USPC .......................................................... 422/90
See application file for complete search history.

(56) References Cited

U.S. PATENT DOCUMENTS

| | | |
|---|---|---|
| 2005/0137331 A1 | 6/2005 | Forshey et al. |
| 2006/0214159 A1* | 9/2006 | Nakayama ............ H01L 51/052 257/40 |
| 2006/0273356 A1 | 12/2006 | Matsumoto et al. |
| 2007/0278481 A1* | 12/2007 | Lee ........................ B82Y 10/00 257/40 |
| 2010/0178485 A1 | 7/2010 | Forshey et al. |
| 2010/0224867 A1* | 9/2010 | Heuft .................... C09B 57/008 257/40 |
| 2010/0248209 A1 | 9/2010 | Datta et al. |
| 2011/0121273 A1* | 5/2011 | Jo ......................... C01B 32/174 257/40 |
| 2011/0180427 A1 | 7/2011 | Matsumoto et al. |
| 2011/0183438 A1 | 7/2011 | Matsumoto et al. |
| 2011/0223422 A1 | 9/2011 | Forshey et al. |
| 2012/0118761 A1 | 5/2012 | Chiba et al. |
| 2012/0138247 A1 | 6/2012 | Forshey et al. |
| 2012/0270046 A1 | 10/2012 | Forshey et al. |
| 2013/0251994 A1 | 9/2013 | Forshey et al. |
| 2013/0338041 A1 | 12/2013 | Hamasaki et al. |
| 2014/0113127 A1 | 4/2014 | Tominaga et al. |
| 2014/0162893 A1 | 6/2014 | Cash et al. |
| 2014/0205838 A1 | 7/2014 | Forshey et al. |
| 2015/0051101 A1* | 2/2015 | Hoshino .............. G01N 33/582 506/9 |
| 2015/0119263 A1* | 4/2015 | Johnson, Jr. ...... G01N 33/54366 506/9 |
| 2016/0155948 A1 | 6/2016 | Murase et al. |
| 2017/0144041 A1 | 8/2017 | Murase et al. |
| 2017/0244041 A1 | 8/2017 | Murase et al. |
| 2017/0370918 A1 | 12/2017 | Cash et al. |

FOREIGN PATENT DOCUMENTS

| | | |
|---|---|---|
| CN | 102472722 A | 5/2012 |
| CN | 103518238 A | 1/2014 |
| CN | 103620406 A | 3/2014 |
| JP | 2005-229017 A | 8/2005 |
| JP | 2006-220513 A | 8/2006 |
| JP | 2008-82987 A | 4/2008 |
| JP | 2008-258594 A | 10/2008 |
| JP | 2009-545723 A | 12/2009 |
| JP | 2010-129742 A | 6/2010 |
| JP | 2012-37397 A | 2/2012 |
| JP | 2012-117883 A | 6/2012 |
| JP | 2012-191874 A | 10/2012 |
| JP | 2013-205159 A | 10/2013 |
| JP | 2014-518567 A | 7/2014 |
| TW | 201505961 A | 2/2015 |
| WO | WO 2012/157506 A1 | 11/2012 |
| WO | WO 2015/012186 A1 | 1/2015 |

OTHER PUBLICATIONS

Taiwanese Office Action and Search Report dated Jan. 9, 2020, for corresponding Taiwanese Application No. 105125377, with English translation.
Extended European Search Report for European Application No. 16835136.9, dated Jan. 8, 2019.
International Search Report, issued in PCT/JP2016/073288, PCT/ISA/210, dated Sep. 13, 2016.
Written Opinion of the International Searching Authority, issued in PCT/JP2016/073288, PCT/ISA/237, dated Sep. 13, 2016.
Chinese Office Action and Search Report for Chinese Application No. 201680046302.X, dated Nov. 7, 2019, with English translation.
Pan et al., "Effect of Functionalized End-Group of mPEG on Surface Property of PMMA/mPEG Blend Film," Plastics, Dec. 31, 2006, pp. 61-64, with English abstract.
Xiao et al., "Study on surface modification of organicsilicone film with biomimetic phosphorycholine via atmospheric pressure plasma induced graft copolymerization," New Chemical Materials, vol. 36, No. 4, Apr. 30, 2008, pp. 54-57, with English abstract.
Japanese Office Action, dated May 7, 2020, for Japanese Application No. 2016-558821, along with an English translation.
Japanese Office Action for Japanese Application No. 2016-558821, dated Oct. 6, 2020, with English translation.

* cited by examiner

[FIG. 1A]
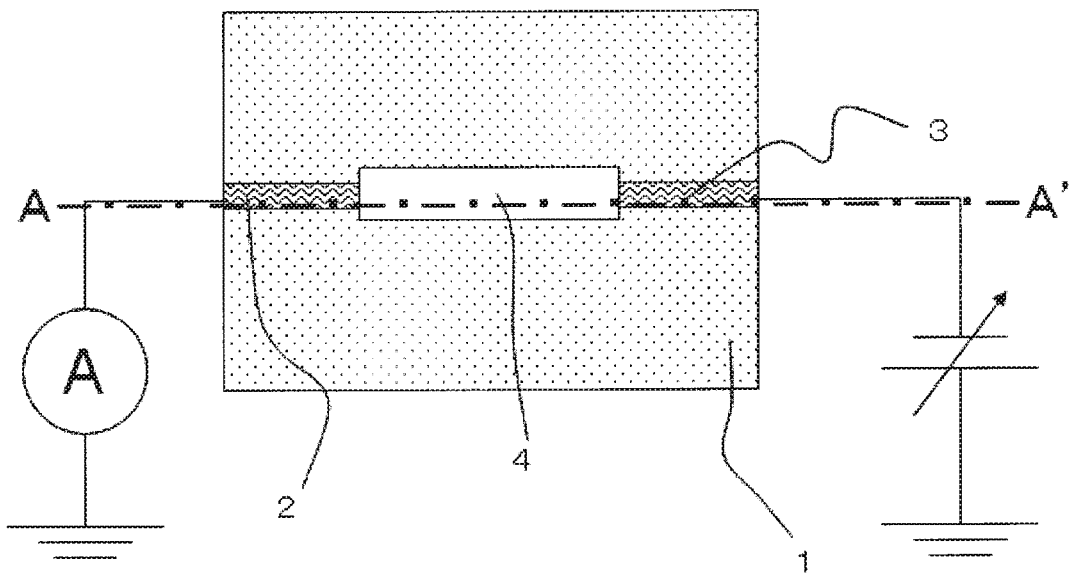
[FIG. 1B]
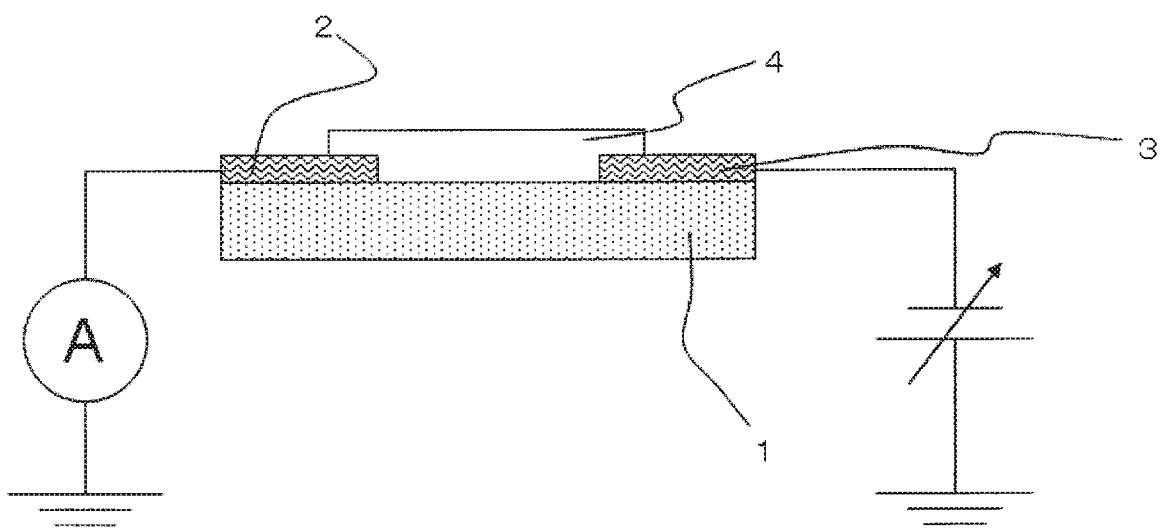

[FIG. 2]
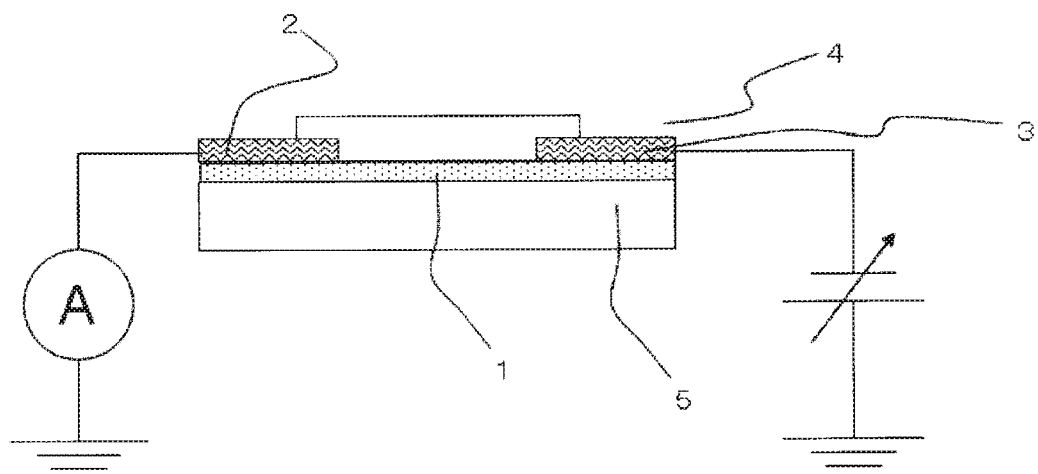
[FIG. 3]
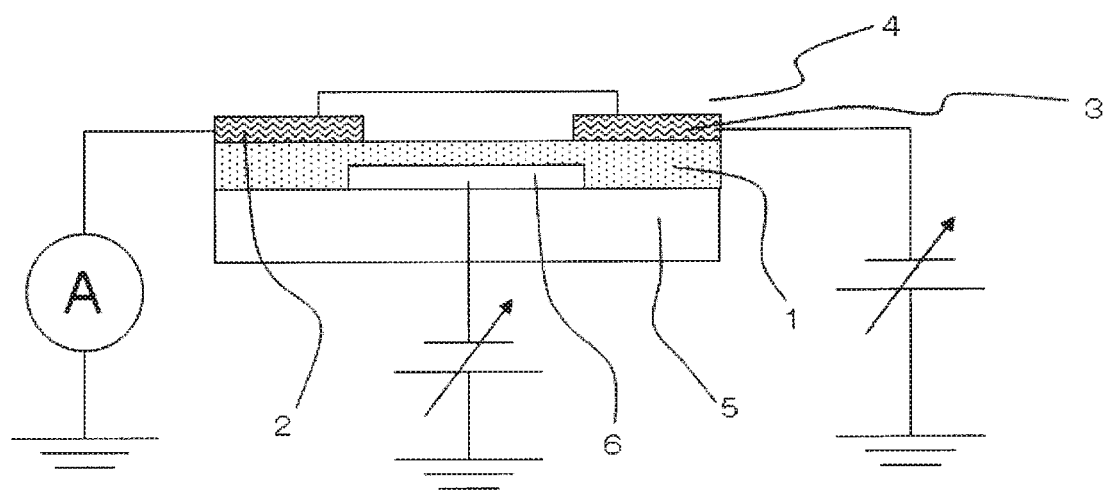

[FIG. 4]
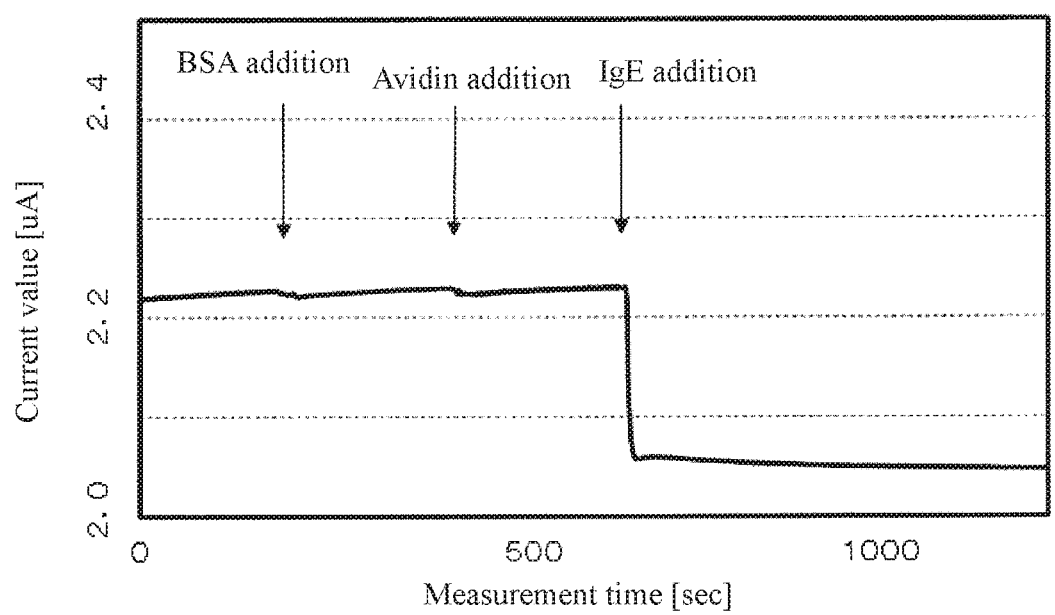

SEMICONDUCTOR ELEMENT, METHOD FOR MANUFACTURING SAME, AND SENSOR IN WHICH SAME IS USED

TECHNICAL FIELD

The present invention relates to a semiconductor element, a method for manufacturing the same, and a sensor using the same.

BACKGROUND ART

Semiconductor elements such as transistors, memories and capacitors have been used for various electronic devices such as displays and computers with utilizing the semiconductor characteristics thereof. For example, IC tags and sensors are being developed which utilize the electric characteristics of a field effect transistor (referred to below as FET). Among these, research on FET type biosensors which detect biological reactions by utilizing a FET is being actively undertaken from the viewpoint that labeling with a fluorescent substance or the like is unnecessary, the electrical signal conversion is fast, and connection to an integrated circuit is easy.

In the related art, a biosensor using an FET has a structure in which a gate electrode is removed from a MOS (metal-oxide-semiconductor) type FET and an ion sensitive film is deposited on an insulation film, and thus, is called an ion sensitive type FET sensor. This biosensor is designed to function as various kinds of biosensor by putting biomolecule substances to be recognized on the ion sensitive film.

However, for application to an immunosensor or the like utilizing an antigen-antibody reaction requiring high-level detection sensitivity, there are technical limitations on the detection sensitivity and it has not been made for practical use yet. In addition, since the process of forming a film of an inorganic semiconductor such as silicon requires expensive manufacturing equipment, it is difficult to reduce costs, and furthermore, since the process is carried out at a very high temperature, there is a problem in that the kinds of materials usable as a substrate are limited and it is not possible to use a lightweight resin substrate or the like.

Meanwhile, FETs using carbon nanotubes (also referred to below as CNTs) having high mechanical and electrical characteristics are known and sensors utilizing the electrical characteristics of CNT-FETs are being developed. For example, a sensor using CNT grown directly on a substrate has been disclosed (e.g., refer to Patent Document 1). In addition, a sensor has been disclosed in which CNTs are dispersed in a solvent and then this dispersion liquid is coated to form a semiconductor layer (refer to, e.g., Patent Documents 2 to 4).

PRIOR ART DOCUMENT

Patent Document

Patent Document 1: JP-A-2005-229017
Patent Document 2: JP-A-2008-258594
Patent Document 3: JP-A-2012-117883
Patent Document 4: WO 2015/012186

SUMMARY OF INVENTION

Problems that the Invention is to Solve

In the techniques described in Patent Documents 1 to 4, there is a problem in that, when detecting a target substance to be sensed, the target substance adheres to portions other than a sensing portion, which hinders detection of the target substance. There is also a problem in that, when arranging a bio-related substance which selectively interacts with a target substance to be sensed in the sensing portion, the biological substance to be recognized also adheres to portions other than the sensing portion, which hinders detection of the target substance.

In view of the above problems, an object of the present invention is to provide a semiconductor element having high-level detection sensitivity when used as a sensor.

Means for Solving the Problems

In order to solve the above problem, the present invention has the following configuration. That is, provided is a semiconductor element including an organic film, a first electrode, a second electrode, and a semiconductor layer, in which the first electrode, the second electrode and the semiconductor layer are formed on the organic film, the semiconductor layer is arranged between the first electrode and the second electrode, the semiconductor layer contains at least one kind selected from organic semiconductors, carbon nanotubes and graphenes, and the organic film has a water contact angle of 5° or more and 50° or less.

Advantageous Effects of Invention

According to the semiconductor element of the present invention, it is possible to provide a sensor having high-level detection sensitivity.

BRIEF DESCRIPTION OF DRAWINGS

FIG. 1A is a schematic plan view illustrating an example of a semiconductor element of the present invention.

FIG. 1B is a schematic cross-sectional view illustrating an example of a semiconductor element of the present invention.

FIG. 2 is a schematic cross-sectional view illustrating an example of a semiconductor element of the present invention.

FIG. 3 is a schematic cross-sectional view illustrating an example of a semiconductor element of the present invention.

FIG. 4 is a graph showing current values flowing between a first electrode and a second electrode when BSA, avidin, and IgE are added to a semiconductor layer of a semiconductor element described in one Example of the present invention.

MODE FOR CARRYING OUT THE INVENTION

<Semiconductor Element>

A semiconductor element of the present invention includes an organic film, a first electrode, a second electrode, and a semiconductor layer, in which the first electrode, the second electrode and the semiconductor layer are formed on the organic film, the semiconductor layer is arranged between the first electrode and the second electrode, the semiconductor layer contains at least one kind selected from organic semiconductors, carbon nanotubes (CNTs) and graphenes, and the organic film has a water contact angle of 5° or more and 50° or less.

FIG. 1A is a schematic plan view illustrating an example of a semiconductor element of the present invention, and FIG. 1B is a cross-sectional view taken along a line AA' in FIG. 1A. In the semiconductor element of FIG. 1A and FIG. 1B, a first electrode 2 and a second electrode 3 are formed on an organic film 1, and a semiconductor layer 4 is arranged in a region including a space between the first electrode 2 and the second electrode 3.

The semiconductor elements illustrated in FIG. 2 and FIG. 3 are modified examples of the semiconductor element illustrated in FIG. 1A and FIG. 1B, which are the same as the semiconductor element illustrated in FIG. 1A in a plan view but different in a cross-sectional view. FIG. 2 and FIG. 3 illustrate cross-sectional views at the same places as in the case of FIG. 1.

In the semiconductor element of FIG. 2, the organic film 1 is formed on a substrate 5 and the first electrode 2 and the second electrode 3 are formed thereon, and the semiconductor layer 4 is arranged in a region including a space between the first electrode 2 and the second electrode 3.

In the semiconductor element of FIG. 3, a gate electrode 6 and the organic film 1 are formed on the substrate 5 and the first electrode 2 and the second electrode 3 are formed thereon, and the semiconductor layer 4 is arranged in a region including the space between the first electrode 2 and the second electrode 3. The semiconductor element of FIG. 3, in which the first electrode 2 and the second electrode 3 correspond to a source electrode and a drain electrode, respectively, and the organic film 1 corresponds to an insulation layer, has a function as an FET.

Examples of the material used for the substrate include inorganic materials such as silicon wafer, glass and alumina sintered body, organic materials such as polyimide, polyester, polycarbonate, polysulfone, polyethersulfone, polyethylene, polyphenylene sulfide, polyparaxylene, polyimide, polyvinyl alcohol, polyvinyl chloride, polyethylene terephthalate, polyvinylidene fluoride, polysiloxane, and polyvinyl phenol, and mixtures of inorganic material powders and organic materials. These materials may be used alone, or a plurality of materials may be laminated or mixed for use.

Examples of the material used for the first electrode 2 and the second electrode 3 include conductive metal oxides such as tin oxide, indium oxide and indium tin oxide (ITO), metals such as platinum, gold, silver, copper, iron, tin, zinc, aluminum, indium, chromium, lithium, sodium, potassium, cesium, calcium, magnesium, palladium, molybdenum, amorphous silicon, and polysilicon, or alloys thereof, inorganic conductive substances such as copper iodide and copper sulfide, organic conductive substances such as polythiophene, polypyrrole, polyaniline, and composites of polyethylene dioxythiophene and polystyrenesulfonic acid, nano carbon materials such as carbon nanotubes and graphenes, and the like, without being limited thereto.

These electrode materials may be used alone, or a plurality of materials may be laminated or mixed for use. In the case of being used as a sensor, from the viewpoint of stability with respect to aqueous solutions or the like coming into contact therewith, the first electrode 2 and the second electrode 3 are preferably selected from gold, platinum, palladium, organic conductive materials, and nano-carbon materials.

The width, thickness, spacing, and arrangement of the first electrode and the second electrode are arbitrary. It is preferable that the width is from 1 μm to 1 mm, the thickness is from 1 nm to 1 μm and the electrode interval is from 1 μm to 10 mm. For example, the first electrode and the second electrode having a width of 100 μm and a thickness of 500 nm are arranged at intervals of 2 mm, without being limited thereto.

In a FET, the current flowing between the source electrode and the drain electrode can be controlled by changing the gate voltage. The mobility of the FET can be calculated by using the following equation (a).

$$\mu = (\delta Id/\delta Vg) L \cdot D/(W \cdot \varepsilon_r \cdot \varepsilon \cdot Vsd) \quad \text{(a)}$$

Here, Id is the source-drain current, Vsd is the source-drain voltage, Vg is the gate voltage, D is the thickness of the insulation layer, L is the channel length, W is the channel width, $\varepsilon_r$ is the relative dielectric constant of the gate insulation layer, ε is the dielectric constant of a vacuum ($8.85 \times 10^{-12}$ F/m), δId/δVg is the change of Id with respect to the amount of change in Vg.

In addition, it is possible to determine the on/off ratio from the ratio of the maximum value of Id and the minimum value of Id.

(Organic Film)

The semiconductor element of the present invention contains an organic film and has a water contact angle with respect to the organic film of 5° or more and 50° or less. Thus, it is easy to detect a substance to be sensed. This is because the detection sensitivity at the sensing portion is increased by suppressing adhesion of the substance to be sensed to portions other than the sensing portion.

In addition, as will be described below, in the case where the substance to be sensed is a substance detected by selective interaction with a certain bio-related substance and the substance to be sensed is detected by including the bio-related substance in the sensing portion of the sensor, in order to manufacture the sensor, the semiconductor element may be exposed to a solution containing the bio-related substance to fix the bio-related substance to the sensing portion in some cases. At that time, the bio-related substances are selectively fixed to the sensing portion by suppressing the bio-related substance from adhering to portions other than the sensing portion. Due to this, the substance to be sensed is suppressed from being captured by a bio-related substance at a part other than the sensing portion, thus the detection sensitivity at the sensing portion is increased.

It is presumed that the reason why adhesion of the substance to be sensed or the bio-related substance which selectively interacts with the substance to be sensed to a part other than the sensing portion is suppressed is that the hydrophobic interaction which is a main factor of the adhesion to the film is reduced due to the organic film being hydrophilic with a water contact angle of 5° or more and 50° or less.

In addition, in the case where the substance to be sensed or the bio-related substance which selectively interacts with the substance to be sensed is included in a medium such as water or blood, it is presumed that the organic film being hydrophilic with a water contact angle of 5° or more and 50° or less makes the medium easily compatible with the film, makes the medium easily enter between the film and the substance, and reduces adhesion of the substance to be sensed and the bio-related substance which selectively interacts with the substance to be sensed to the film.

Here, the contact angle refers to the angle between the tangential line and the surface of the organic film when a tangential line is drawn from the contacting part of the organic film, water, and air to the curved surface of water. In the present invention, the contact angle is a value measured by the static method in "Method for Testing Wettability of Substrate Glass Surface" specified in JIS 83257: 1999.

The water contact angle with respect to the organic film being 5° or more makes it possible to suppress peeling of the CNT from the organic film and to stably detect the substance to be sensed. It is more preferably 15° or more, and even more preferably 35° or more.

The organic film 1 may be used as a film of an organic film alone, but is more preferably used as a film formed on a substrate.

As a method for forming the organic film 1, it is possible to preferably use, for example, a spin coating method, a blade coating method, a slit die coating method, a screen printing method, a bar coater method, a mold method, a printing transfer method, a dipping and lifting method, an ink jet method, a method in which an ultraviolet ozone treated substrate is immersed and reacted in a reaction solution such as a silane coupling agent and then washed and dried, or the like. It is possible to select the coating method according to coating film characteristics to be obtained, such as the coating film thickness control and orientation control. In addition, the formed coating film may be subjected to an annealing treatment under a normal atmosphere, under reduced pressure, or in an inert gas atmosphere (under a nitrogen or argon atmosphere).

Examples of materials used for the organic film include organic materials, including polysiloxane, polyacrylic acid, polymethacrylic acid, alkylene glycols such as polyethylene glycol and polypropylene glycol, sugars such as amylose and cellulose, phospholipids such as phosphatidylcholine and sphingomyelin, protein such as *bovine* serum albumin, a silane coupling agent containing a polyethylene glycol chain or a phosphorylcholine group, or a mixture of an inorganic material powder such as a silica sintered body or an alumina sintered body and the organic material. Preferred is a polysiloxane.

The functional group of the compound used for the organic film is preferably a nonionic functional group or a zwitterionic functional group. Using the functional group described above makes it possible to reduce the charge on the surface of the organic film, to suppress variations in the threshold voltage of the semiconductor element and charge injection into the semiconductor layer, and to stably detect proteins.

From the viewpoint of the effect of suppressing the adhesion of the substance to be sensed and the bio-related substance which selectively interacts with the sensing target to the organic film, the nonionic functional group or zwitterionic functional group described above preferably has at least one structure selected from a polyethylene glycol chain, a phosphorylcholine group, a 1,2-dihydroxyethyl group, a 1,2-dihydroxyethylene group, and a hydroxyethyloxy group.

It is presumed that, due to the steric hindrance and free motion of these structures, a medium such as water easily enters between the film and the substance, and the effect of reducing the adhesion of the substance to be sensed and the bio-related substance to the film becomes greater. Examples of compounds having these structures include polysaccharides having these structures, silane coupling agents having these structures, polymers having these structures in side chains, and the like.

Examples of the compound having a polyethylene glycol chain include polyethylene glycol; silane coupling agents containing a polyethylene glycol chain, such as [(polyoxyethylene)propyl]triethoxysilane; polymers having a polyethylene glycol chain in a side chain, such as poly(1-(polyoxyethylene)ethylene) and poly(polyethylene glycol acrylate); and the like.

Examples of the compound having a phosphorylcholine group include phospholipids such as sphingomyelin; silane coupling agents containing a phosphorylcholine group, such as phosphorylcholine propyltriethoxysilane; polymers containing a phosphorylcholine group in the side chain, such as poly(1-(ethylphosphorylcholine)ethylene) or poly(ethyl acrylate phosphorylcholine); and the like.

Examples of the compound having a 1,2-dihydroxyethyl group include polysaccharides such as amylose, cellulose and carboxymethyl cellulose; silane coupling agents containing a 1,2-dihydroxyethyl group, such as N-(3-triethoxysilylpropyl)glucosamide; polymers having a 1,2-dihydroxyethyl group in the side chain, such as poly(1-(1,2-dihydroxyethyl)ethylene) or poly(1,2-dihydroxyethyl acrylate); and the like.

Examples of the compound having a 1,2-dihydroxyethylene group include polysaccharides such as amylose, cellulose, and carboxymethyl cellulose; silane coupling agents containing a 1,2-dihydroxyethylene group, such as N-(3-triethoxysilylpropyl)glucosamide; polymers having a 1,2-dihydroxyethylene group in the side chain, such as poly(1-(glucoside)ethylene) and poly(glucoside ethyl acrylate); and the like.

Examples of the compound having a hydroxyethyloxy group include silane coupling agents containing a hydroxyethyloxy group, such as (hydroxyethyloxypropyl)triethoxysilane; polymers having a hydroxyethyloxy group in the side chain, such as poly(1-(hydroxyethyloxy)ethylene) and poly(hydroxyethyl acrylate); and the like.

These compounds may be used singly or two or more kinds of compounds may be used in a combination.

The organic film preferably contains a cross-linked polymer. This is because the hydrophilic organic film material having a water contact angle of 5° or more and 50° or less is easily soluble in water and does not function as a film, thus, it is preferable to include a cross-linked structure. It is more preferable that the compound used for the organic film is a cross-linked polymer.

The functional group of the cross-linked polymer is preferably a nonionic functional group or a zwitterionic functional group. More preferred is at least one structure selected from a polyethylene glycol chain, a phosphorylcholine group, a 1,2-dihydroxyethyl group, a 1,2-dihydroxyethylene group, a hydroxyethyloxy group, and a hydroxy group. This is because it is possible to reduce the charge on the surface of the organic film and the effect of suppressing the adhesion of the substance to be sensed and the bio-related substance which selectively interacts with the sensing target to the organic film is excellent. It is particularly preferred that the cross-linked polymer contains a cross-linked product of polyvinyl alcohol.

(Semiconductor Layer)

The semiconductor element of the present invention can detect the substance to be sensed with high-level sensitivity since the semiconductor layer contains one kind or more selected from organic semiconductors, carbon nanotubes (CNTs) and graphenes. It is more preferred that the semiconductor layer includes carbon nanotubes (CNTs).

As the organic semiconductor, any material that is soluble in a solvent and that exhibits semiconductivity can be used regardless of its molecular weight. In addition, a material having high carrier mobility can be used preferably.

The kind of the organic semiconductor is not particularly limited, but examples thereof include polythiophenes such as poly-3-hexylthiophene and polybenzothiophene, polypyrroles, poly(p-phenylenevinylene)s such as poly(p-phenylenevinylene), polyanilines, polyacetylenes, polydiacetylenes, polycarbazoles, polyfurans such as polyfuran and polybenzofuran, polyheteroaryls having a nitrogen-containing aromatic ring as a constituent unit, such as pyridine, quinoline, phenanthroline, oxazole, and oxadiazole, condensed polycyclic low molecular semiconductors such as anthracene, pyrene, naphthacene, pentacene, hexacene, and rubrene, low molecular semiconductors having a heteroaromatic ring such as furan, thiophene, benzothiophene, dibenzofuran, pyridine, quinoline, phenanthroline, oxazole, and oxadiazole, and the like.

Examples of graphenes include single layer graphene, multilayer graphene, graphene oxide, graphene nanoribbons, and the like.

As the carbon nanotubes (CNTs), any of single layer CNTs in which a single carbon film (graphene sheet) is wound in a cylindrical shape, double layer CNTs in which two graphene sheets are wound concentrically, and multilayered CNTs in which a plurality of graphene sheets are wound concentrically may be used. In order to obtain high semiconductor characteristics, it is preferable to use a single layer CNT.

CNTs can be obtained by, for example, an arc discharge method, a chemical vapor deposition method (CVD method), a laser ablation method, or the like.

In addition, CNT preferably includes semiconductor type carbon nanotube (semiconducting type CNT) as 90% by weight or more. More preferably, it includes 95% by weight or more of the semiconductor type CNT. It is possible to use a known method as a method for obtaining the CNT having 90% by weight or more of the semiconductor type. Examples thereof include a method of carrying out ultracentrifugation in the presence of a density gradient agent, a method for selectively adhering a specific compound to the surface of a semiconductor type or metal type CNT, and carrying out separation by utilizing a difference in solubility, and a method for carrying out separation by electrophoresis utilizing a difference in electrical characteristics, or the like. Examples of a method for measuring the content ratio of the semiconductor type CNT include a method for calculating from the absorption area ratio of the visible-near infrared absorption spectrum, a method for calculating from the intensity ratio of the Raman spectrum, and the like.

In the present invention, it is preferable that the length of the CNT be shorter than the distance between the first electrode and the second electrode in the semiconductor element or sensor to which the CNT are applied. Specifically, the average length of the CNT depends on the channel length, but is preferably 2 µm or less, and more preferably 1 µm or less. The average length of the CNT means the average value of the lengths of twenty CNTs picked out at random.

Examples of a method for measuring the average length of the CNT include a method in which 20 CNTs are randomly picked out from an image obtained by an atomic force microscope, a scanning electron microscope, a transmission electron microscope, or the like, and the average value of the lengths thereof is obtained.

Generally commercially available CNTs have a distribution in the lengths thereof and CNTs longer than inter-electrode sometimes may be included, thus it is preferable to add a step of making the CNTs shorter than the inter-electrode distance. For example, a method is effective in which the CNTs are cut into short fibers by an acid treatment with nitric acid, sulfuric acid or the like, by an ultrasonic treatment, by a freeze pulverization method, or the like. In addition, it is more preferable to combine the method with separation by a filter from the viewpoint of improving purity.

Although the CNT diameter is not particularly limited, it is preferably 1 nm or larger and 100 nm or smaller, and more preferably 50 nm or smaller.

In the present invention, it is preferable to provide a step of uniformly dispersing CNT in a solvent and filtering the dispersion liquid through a filter. Obtaining CNTs smaller than the filter pore size from the filtrate makes it possible to efficiently obtain CNTs shorter than the inter-electrode. In this case, a membrane filter is preferably used as a filter. The pore size of the filter used for filtration only has to be smaller than the channel length, and is preferably from 0.5 to 10 µm.

Other methods for shortening the CNT include an acid treatment, a freeze pulverization treatment, and the like.

In addition, the CNT contained in the semiconductor layer is preferably a carbon nanotube composite (CNT composite), to at least a part of the surface of which a polymer is adhered. Adhering a polymer to at least a part of the surface of CNT makes it possible to uniformly disperse the CNT in a solution without impairing high electrical characteristics of the CNT. In addition, it is possible to form a uniformly dispersed CNT film from a solution in which CNT is uniformly dispersed, by a coating method. Due to this, it is possible to realize high semiconductor characteristics.

A state in which a polymer adheres to at least a part of the surface of CNT means a state in which a part of or the entire surface of the CNT is coated with the polymer.

It is presumed that the reason why a polymer can coat CNT is because of the hydrophobic interaction between the polymer and the CNT. In addition, in the case where the polymer has a conjugated structure, it is presumed that the interaction is generated by overlapping π electron clouds derived from the conjugated structure of each of the polymer and the CNT.

When CNT is coated with a polymer, the reflection color of the CNT changes from the color of the uncoated CNT to be closer to the color of the polymer. Whether or not CNT is covered can be judged by observing this. Quantitatively, the presence of deposits is confirmed by elemental analysis such as X-ray photoelectron spectroscopy (XPS) and the weight ratio of the deposits to CNT can be measured.

Examples of the method for adhering a polymer to CNT include (I) a method for adding CNT to the molten polymer and mixing, (II) a method in which the polymer is dissolved in a solvent and CNT is added thereto and mixed, (III) a method in which CNT is preliminarily dispersed beforehand with ultrasonic waves or the like and then the polymer is added thereto and mixed, (IV) a method in which the polymer and CNT are put in a solvent, and the mixture is irradiated with ultrasonic waves, followed by mixing, and the like. In the present invention, any method may be used, and any of these methods may be combined.

Examples of the polymer include celluloses such as cellulose and carboxymethyl cellulose, acrylic resins such as polyhydroxymethyl methacrylate, polyacrylic acid, alginic acid, sodium alginate, polyvinylsulfonic acid, sodium polyvinylsulfonate, polystyrenesulfonic acid, sodium polystyrenesulfonate, polyvinyl alcohol, polyalkylene glycols such as polyethylene glycol, polythiophene-based polymers such as poly-3-hexylthiophene, polypyrrole-based polymers, polyaniline-based polymers, polyacetylene-based polymers, poly-p-phenylene-based polymers, poly-p-phenylene vinylene-based polymers, and the like, without being particularly limited.

These polymers may be used singly or two or more kinds of compounds may be used. As the above polymer, one in which single monomer units are lined up is preferably used, but one obtained by block copolymerization of different monomer units or one randomly copolymerized may also be used. In addition, graft-polymerized one can also be used.

From the viewpoint of interaction with CNT, a conjugated polymer is particularly preferable. In the case of a conjugated polymer, it is possible to uniformly disperse CNT in a solution without impairing high electrical characteristics of the CNT, and to realize higher semiconductor characteristics.

The conjugated polymer is not necessarily required to have a high molecular weight, and may be an oligomer formed of a linear conjugated system. A preferable molecular weight of the conjugated polymer is from 800 to 100,000 in terms of the number average molecular weight.

Specific examples of the conjugated polymer having the above-mentioned structure include the following structures. Here, n in each structure represents the number of repetitions and is in the range of from 2 to 1,000. In addition, the conjugated polymer may be a single polymer of each structure or a copolymer.

[Chem. 1]

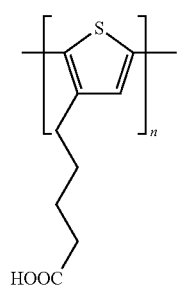
(1)

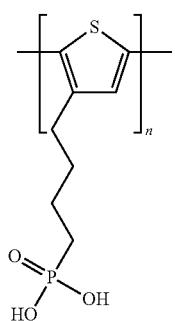
(2)

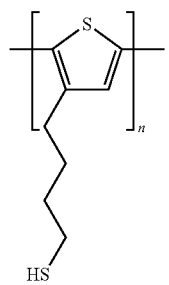
(3)

(4)

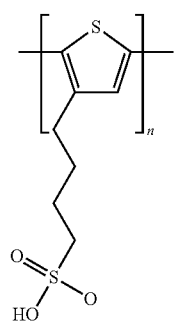
(5)

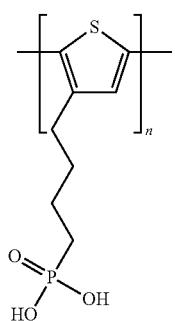
(6)

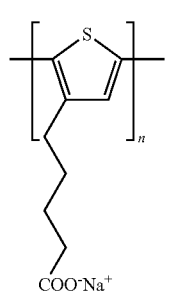
(7)

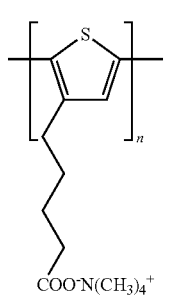
(8)

-continued
(9)
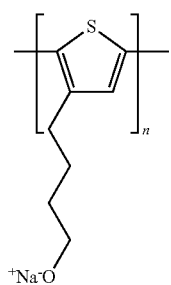
(10)
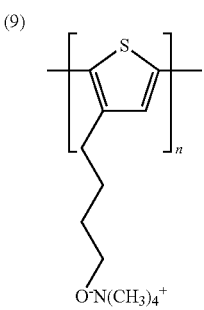
(11)
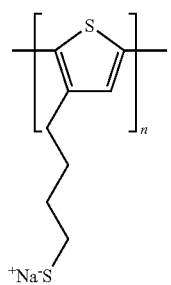
(12)
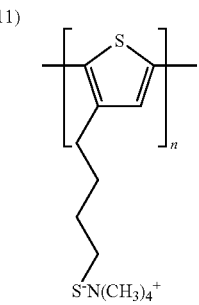
(13)
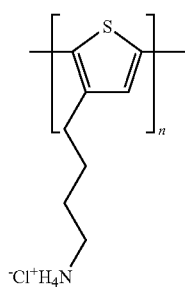
(14)
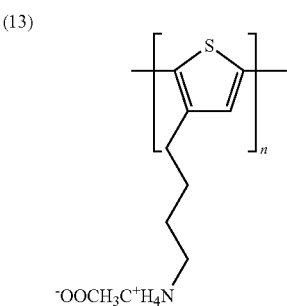
(15)
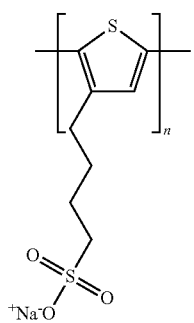
(16)
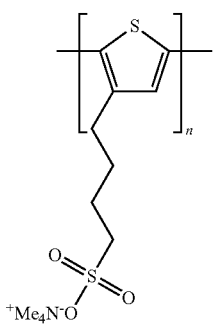
(17)
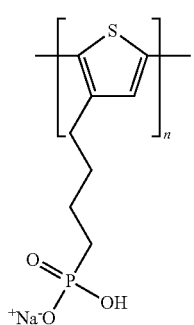
(18)
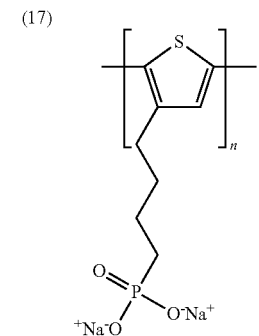

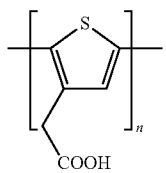 (19)
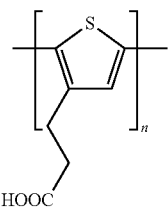 (20)
[Chem. 2]
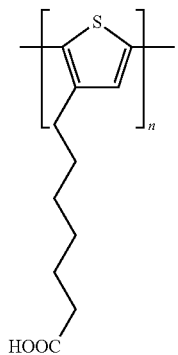 (21)
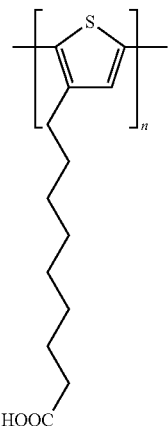 (22)
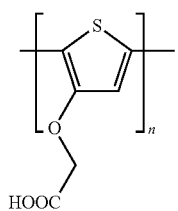 (23)
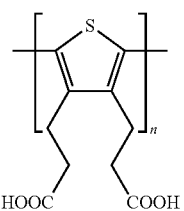 (24)
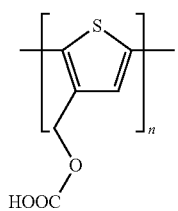 (25)
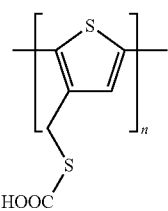 (26)
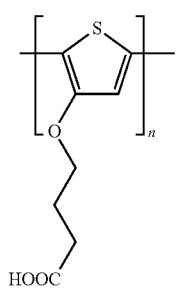 (27)
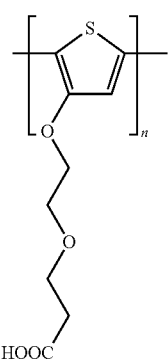 (28)

-continued
(29)
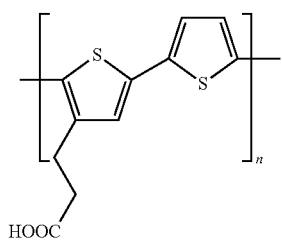
(30)
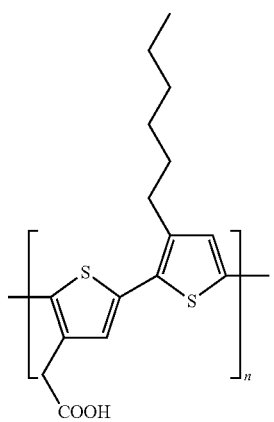
(31)
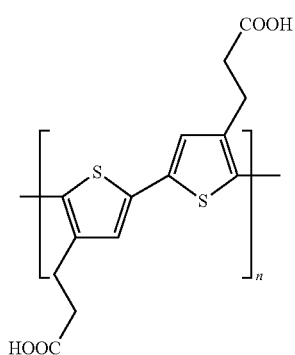
(32)
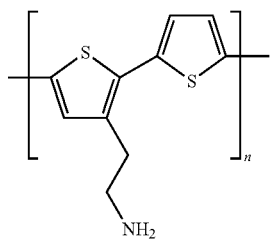
(33)
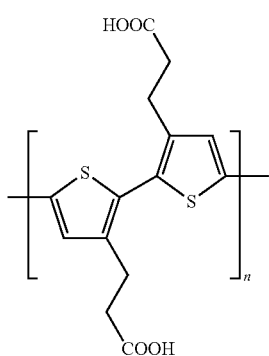
(34)
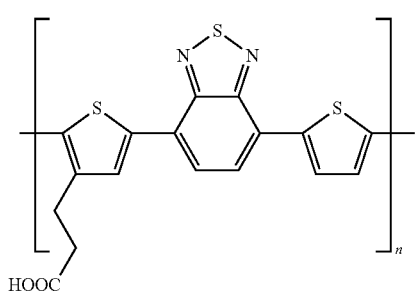
(35)
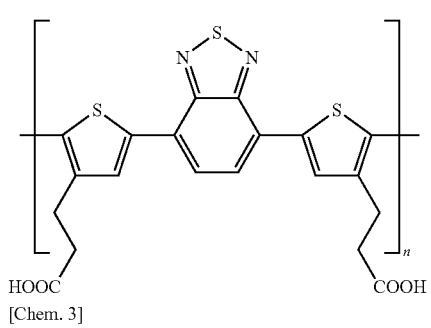
[Chem. 3]

-continued
(36)
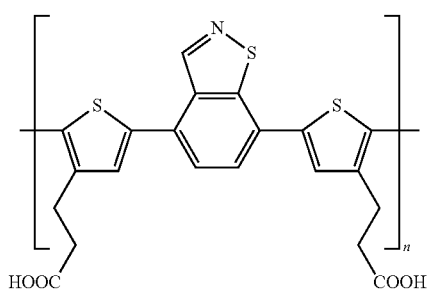
(37)
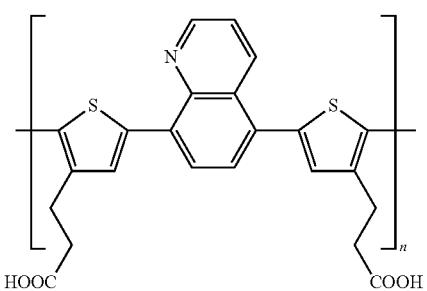
(38)
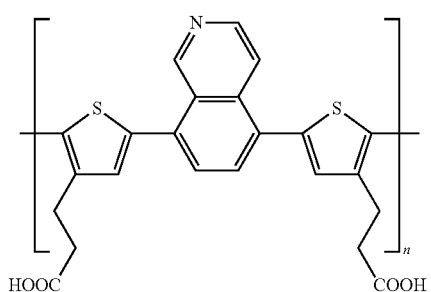
(39)
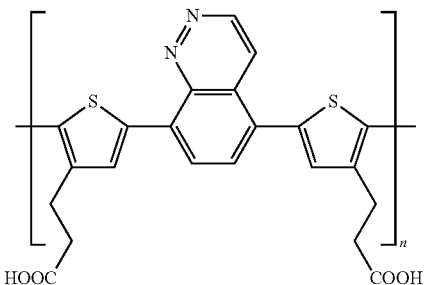
(40)
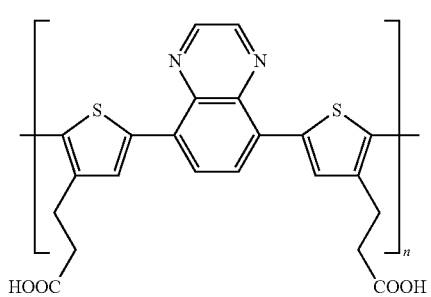
(41)
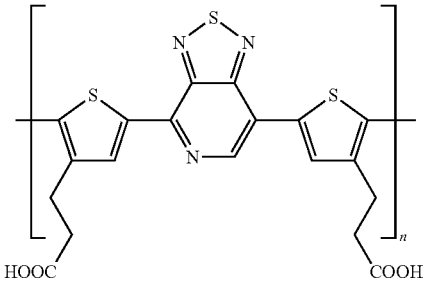
(42)
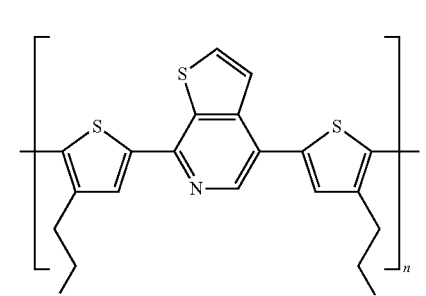
(43)
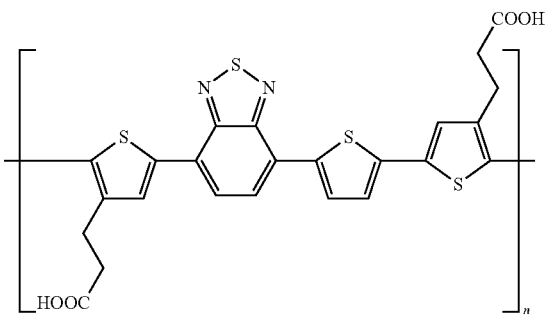
[Chem. 4]
(44)
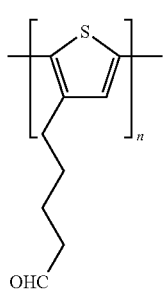
(45)
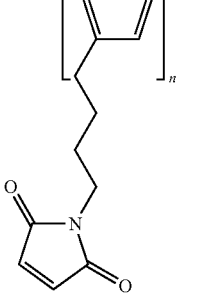

-continued
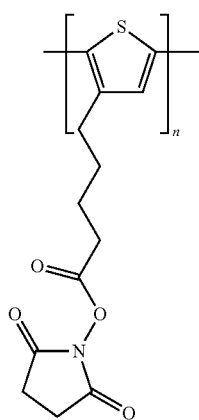 (46)
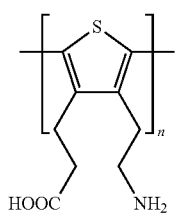 (47)
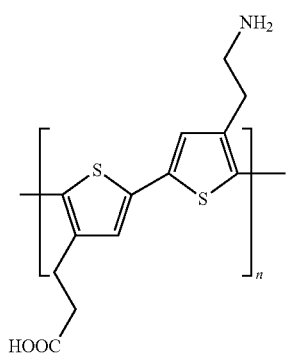 (48)
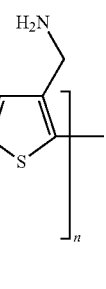 (49)
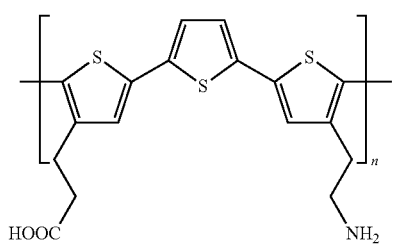 (50)
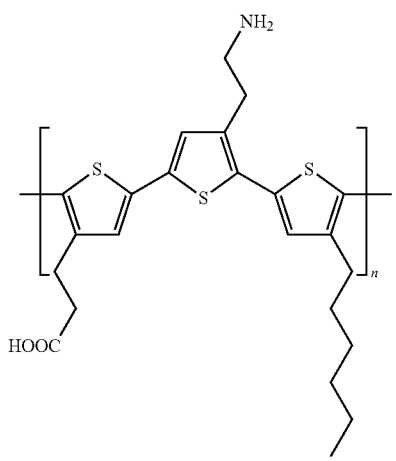 (51)
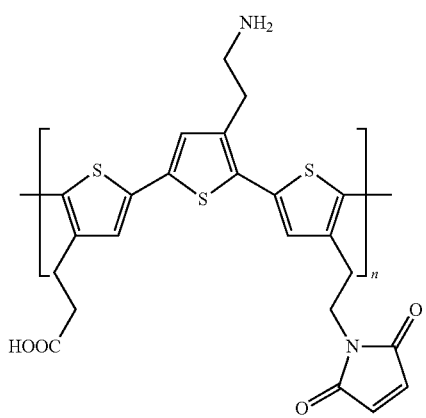 (52)
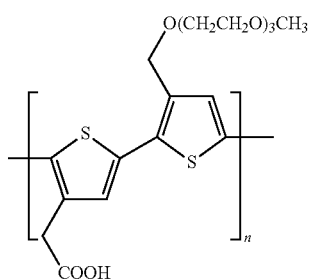 (53)

-continued
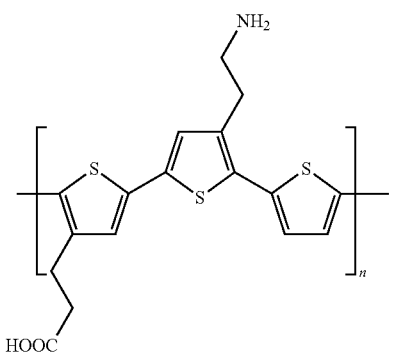
(54)
[Chem. 5]
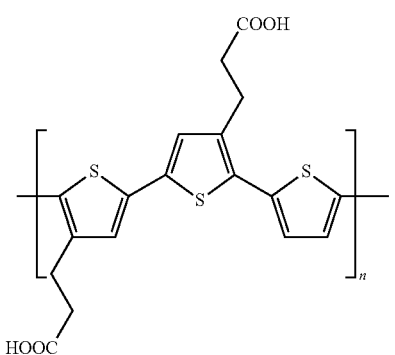
(55)
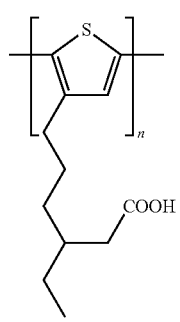
(56)
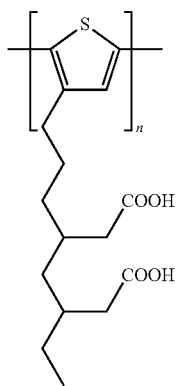
(57)
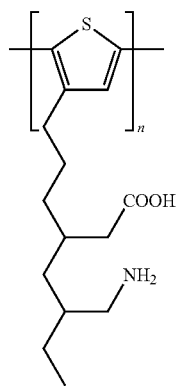
(58)
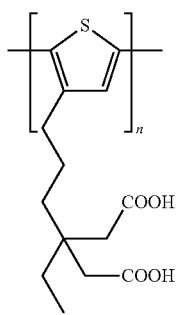
(59)
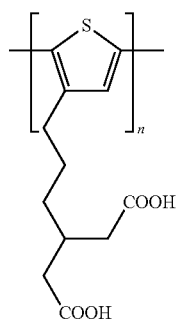
(60)

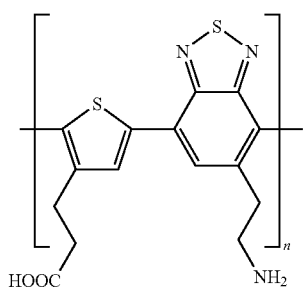
(61)
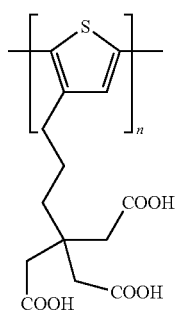
(62)
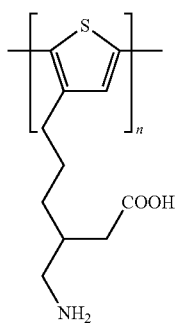
(63)
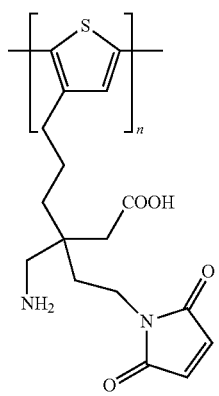
(64)
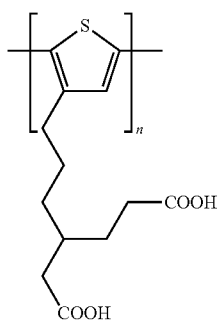
(65)
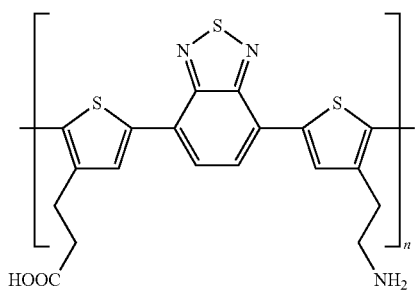
(66)
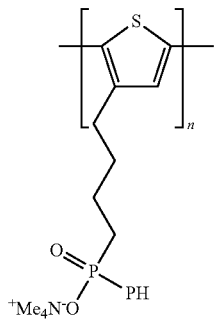
(67)
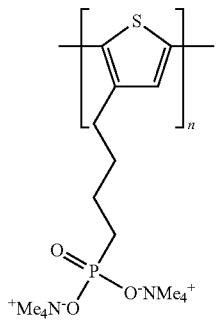
(68)
[Chem. 6]
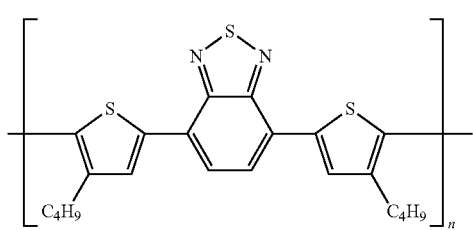
(70)
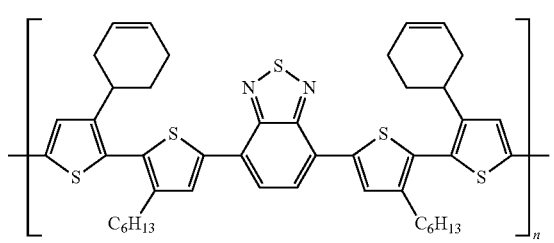
(71)

-continued
(72)
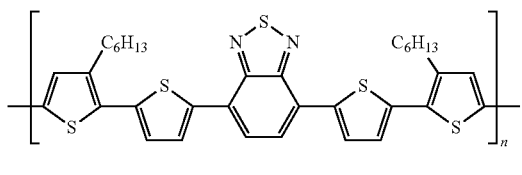
(73)
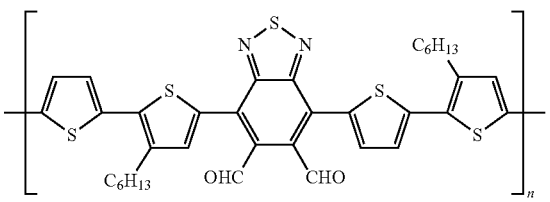
(74)
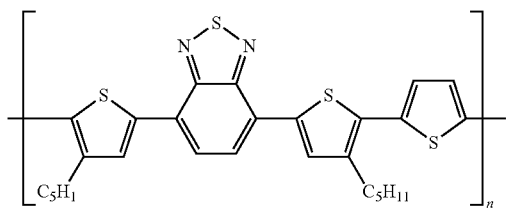
(75)
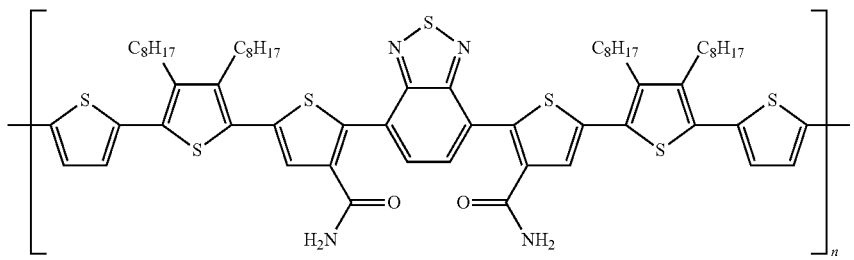
(76)
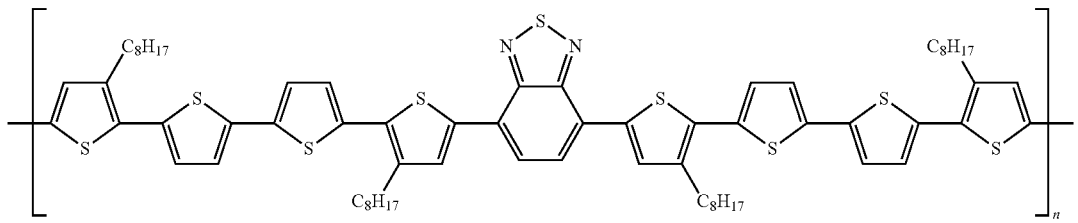
[Chem. 7]
(77)
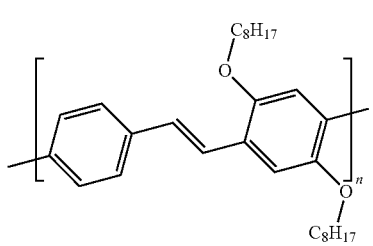
(78)
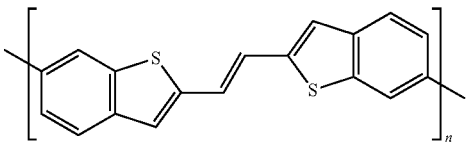
(79)
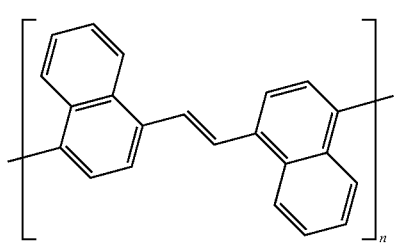
(80)
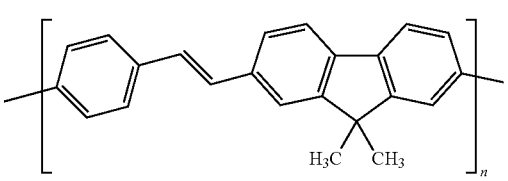
(81)
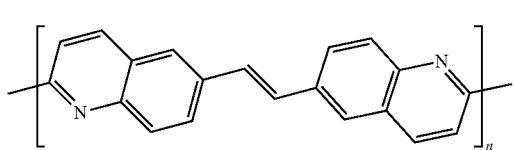
(82)
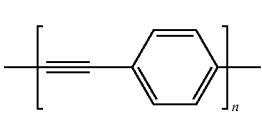

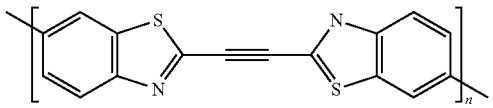
(83)

The conjugated polymer used in the present invention can be synthesized by a known method. In order to synthesize the monomer, examples of a method for connecting a thiophene derivative in which a side chain is introduced to thiophene, include a method for coupling a halogenated thiophene derivative and a thiopheneboronic acid or thiopheneboronic acid ester under a palladium catalyst, a method for coupling a halogenated thiophene derivative and a thiophene Grignard reagent under a nickel or palladium catalyst, and the like.

In addition, even in the case of linking a unit other than the above-mentioned thiophene derivative to a thiophene, a coupling can be carried out by a method using a halogenated unit in a similar manner. In addition, a conjugated polymer can be obtained by introducing a polymerizable substituent at an end of the monomer obtained in this manner and allowing the polymerization to proceed under a palladium catalyst or a nickel catalyst.

From the conjugated polymer used in the present invention, impurities such as raw materials used in the synthesis process or by-products are preferably removed, and, for example, it is possible to use silica gel column chromatography method, Soxhlet extraction method, a filtration method, an ion exchanging method, a chelating method, or the like. Two or more of these methods may be combined.

The semiconductor layer 4 may further include an organic semiconductor or an insulating material as long as the electrical characteristics of CNT and CNT composite are not inhibited. In addition, two or more kinds of organic semiconductors, CNTs, and graphenes may be used in combination.

The film thickness of the semiconductor layer 4 is preferably 1 nm or more and 100 nm or less. Within this range, a change in electrical characteristics due to interaction with the substance to be sensed can be sufficiently extracted as an electric signal. It is more preferably 1 nm or more and 50 nm or less, and even more preferably 1 nm or more and 20 nm or less. Here, the film thickness of the semiconductor layer refers to the film thickness on the organic film.

As a method for forming the semiconductor layer 4, use can be made of, for example, a wet method such as a coating method, a dry method such as resistance heating vapor deposition, electron beams, sputtering, and CVD, or the like. From the viewpoint of the manufacturing cost and adaptability to a large area, it is preferable to use a coating method.

Specifically, as the coating method, use can be preferably made of a spin coating method, a blade coating method, a slit die coating method, a screen printing method, a bar coater method, a casting method, a printing transfer method, a dipping and lifting method, an ink jet method, or the like, and the coating method can be selected according to the coating film characteristics to be obtained, such as coating film thickness control or orientation control. In addition, the formed coating film may be subjected to an annealing treatment under a normal atmosphere, wider reduced pressure, or in an inert gas atmosphere (under a nitrogen or argon atmosphere).

In addition, the semiconductor layer of the present invention preferably contains a functional group such as a hydroxy group, a carboxy group, an amino group, a mercapto group, a sulfo group, a phosphonic acid group, an organic or inorganic salt thereof, a formyl group, a maleimide group, or a succinimide group, on at least a part thereof. Due to this, it becomes easier to fix a bio-related substance which selectively interacts with a substance to be sensed.

Among these functional groups, an amino group, a maleimide group, and a succinimide group may or may not have a substituent. Examples of the substituent include an alkyl group and the like, and the substituent may be further substituted.

The organic salt in the functional group is not particularly limited, but examples thereof include ammonium salts such as tetramethylammonium salt, pyridinium salts such as N-methylpyridinium salt, carboxylate salts such as imidazolium salt and acetate, sulfonate salts, phosphonate salts, and the like.

The inorganic salt in the functional group is not particularly limited, but examples thereof include alkali metal salts such as a carbonate salt and a sodium salt, alkaline earth metal salts such as a magnesium salt, salts formed of transition metals such as copper, zinc, and iron, salts formed of boron compounds such as tetrafluoroborate, sulfate salts, phosphate salts, hydrochloride salts, nitrate salts, and the like.

Examples of a form of introducing the functional group into the semiconductor layer include a form in which there is the functional group in a part of a polymer adhered to the surface of CNT, a form in which another organic compound is adhered to the surface of CNT and there is the functional group in a part of the organic compound, and the like. From the viewpoint of detection sensitivity, more preferred is a form in which another organic compound different from the polymer described above is adhered to the surface of CNT and there is the functional group in a part of the organic compound.

Examples of the other organic compounds having the functional group include stearylamine, laurylamine, hexylamine, 1,6-diaminohexane, diethylene glycol bis(3-aminopropyl)ether, isophoronediamine, 2-ethylhexylamine, stearic acid, lauric acid, sodium dodecyl sulfate, Tween 20, 1-pyrenecarboxylic acid, 1-aminopyrene, 1-hexabenzocoronenecarboxylic acid, 1-aminohexabenzocoronene, 1-hexabenzocoronenebutanecarboxylic acid, 1-pyrenebutanecarboxylic acid, 4-(pyren-1-yl)butane-1-amine, 4-(pyren-1-yl)butan-1-ol, 4-(pyren-1-yl)butane-1-thiol, 4-(hexabenzocoronene-1-yl)butan-1-amine, 4-(hexabenzocoronene-1-yl)butan-1-ol, 4-(hexabenzocoronene-1-yl)butane-1-thiol, 1-pyrenebutanecarboxylic acid-N-hydroxysuccinimide ester, 1-hexabenzocoronenebutanecarboxylic acid-N-hydroxysuccinimide ester, biotin, biotin-N-hydroxysuccinimide ester, biotin-N-hydroxysulfosuccinimide ester, polyethyleneimine, polyethylene glycol, polyvinyl alcohol, polyacrylic acid, sodium polyacrylate, polyacrylamine, polyacrylamine hydrochloride, polymethacrylic acid, sodium polymethacrylate, polymethacrylamine, polymethacrylamine hydrochloride, alginic acid, sodium alginate, glucose, maltose, sucrose, chitin, amylose, amylopectin, cellulose, carboxymethyl cellulose, sucrose, lactose, cholic acid, sodium cholate, deoxycholic acid, sodium deoxycholate, cholesterol, cyclodextrin, xylan, catechin, poly-3-(ethylsulfonic acid-2-yl)thiophene, poly-3-(ethanoic acid-2-yl)thiophene, poly-3-(2-aminoethyl)thiophene, poly-3-(2-hydroxyethyl)thiophene, poly-3(2-mercaptoethyl)thiophene, polystyrene sulfonic acid, polyvinyl phenol, polyoxypropylenetriol, glutaraldehyde, ethylene glycol, ethylene diamine, poly-1H-(propionate-3-yl)pyrrole, 1-adamantanol, 2-adamantanol, 1-adamantanecarboxylic acid, dodecylbenzenesulfonic acid, sodium dodecylbenzenesulfonate, N-ethylmaleimide, and the like. The organic compound described above may be used alone or two or more kinds of the organic compounds may be used in combination.

Examples of a method for adhering another organic compound to CNT include (I) a method for adding CNT to the molten organic compound and mixing, (II) a method in which the organic compound is dissolved in a solvent and CNT is added thereto and mixed, (III) a method in which CNT is preliminarily dispersed beforehand by ultrasonic waves or the like and then the organic compound is added thereto and mixed, (IV) a method in which the organic compound and CNT are put in a solvent, the mixture is irradiated with ultrasonic waves, followed by mixing, (V) a method in which CNT coated on a substrate is immersed in the molten organic compound, (VI) a method in which the organic compound is dissolved in a solvent, and CNT coated on a substrate is immersed therein, and the like. In the present invention, any method may be used, and any of these methods may be combined.

(Method for Manufacturing Semiconductor Element)

A method for manufacturing the semiconductor element illustrated in FIG. 1A and FIG. 1B is explained. This method for manufacturing a semiconductor element includes a step of coating and drying a solution including CNT to form a semiconductor layer. The manufacturing method is not limited to the following.

First, the first electrode 2 and the second electrode 3 are formed on the organic film 1. Examples of the forming method include known methods such as metal vapor deposition, a spin coating method, a blade coating method, a slit die coaling method, a screen printing method, a bar coater method, a molding method, a printing transfer method, a dipping and lifting method, and an ink jet method. Here, a pattern may be formed directly by using a mask or the like, or it is also possible to coat a resist on the substrate, expose and develop the resist film in a desired pattern, and then carry out etching to pattern the gate electrode.

Next, the semiconductor layer 4 is formed. Specifically, as a method for forming a semiconductor layer by coating and drying a solution containing CNT, use can be preferably made of a spin coating method, a blade coating method, a slit die coating method, a screen printing method, a bar coater method, a molding method, a printing transfer method, a dipping and lifting method, an ink jet method, and the like. The coating method can be selected according to the coating film characteristics to be obtained, such as coating film thickness control or orientation control. In addition, the formed coating film may be subjected to an annealing treatment under a normal atmosphere, under reduced pressure, or in an inert gas atmosphere (under a nitrogen or argon atmosphere).

The solvent used in the coating method is not particularly limited, but examples thereof include water, ethanol, tetrahydrofuran, acetonitrile, N-methylpyrrolidone, γ-butyrolactone, propylene glycol-1-monomethyl ether-2-acetate, chloroform, o-dichlorobenzene, toluene, and the like. These solvents may be used singly or two or more kinds of solvents may be used in a mixture.

In addition, the fixing of a bio-related substance which selectively interacts with a substance to be sensed to the semiconductor layer 4 may be performed separately from the formation of the semiconductor layer, or may be performed as a batch. Examples of the case of carrying out in a separate manner, include a method in which a semiconductor layer is formed on an organic film by coating a CNT solution thereon and then the semiconductor layer is immersed in a solution containing a bio-related substance which selectively interacts with a substance to be sensed.

Examples of the case of carrying out in a batch manner, include a method of forming a semiconductor layer by using a CNT composite having a bio-related substance which selectively interacts with a substance to be sensed in advance. As necessary, excess components may be removed by washing or drying.

The method for manufacturing a sensor containing the semiconductor element illustrated in FIG. 2 is a method in which a step of first forming the organic film 1 on the substrate 5 is added to the method for manufacturing a sensor containing the semiconductor element illustrated in FIG. 1A and FIG. 1B.

(Bio-Related Substance)

In the semiconductor element of the present invention, the semiconductor layer preferably has a bio-related substance which selectively interacts with a substance to be sensed, on at least a part thereof. Due to this, it becomes possible to selectively fix the substance to be sensed to the semiconductor layer.

The bio-related substance is not particularly limited as long as it can selectively interact with the substance to be sensed, and any arbitrary substance can be used. Specific examples thereof include enzymes, antigens, antibodies, aptamers, haptens, hapten antibodies, peptides, oligopeptides, polypeptides (proteins), hormones, nucleic acids, oligonucleotides, biotin, biotinylated proteins, avidin, streptavidin, saccharides such as sugars, oligosaccharides and polysaccharides, low molecular weight compounds, high molecular compounds, inorganic substances and composites thereof, viruses, bacteria, cells, living tissues and substances forming them, and the like.

Among these, antibodies, aptamers, enzymes, low molecular weight compounds, proteins, and oligonucleotides are preferable, low molecular weight compounds, antibodies, aptamers, and enzymes are more preferable, and biotin, antibodies, or aptamers are particularly preferable.

Examples of low molecular compounds include compounds having a molecular weight of about from 100 to 1,000, and examples thereof include biotin, pyrenebutanoic acid succinimide ester, pyrenebutanoic acid maleimide ester, and the like.

Examples of antibodies include anti-PSA, anti-hCG, anti-IgE, anti-BNP, anti-NT-proBNP, anti-AFP, anti-CK-MB, anti-PIVKA II, anti-CA15-3, anti-CYFRA, anti-HIV, anti-troponin T, anti-procalcitonin, anti-HbA1c, anti-apolipoprotein, anti-C reactive protein (CRP), and the like. Among these, the IgG type is preferable, and an antibody having only a variable site (Fab) fragment is particularly preferable.

Examples of aptamers include oligonucleotide aptamers and peptide aptamers. Specific examples thereof include IgE aptamers, PSA aptamers, thrombin aptamers, and the like. Examples of enzymes include glucose oxidase, peroxidase and the like.

Among these, biotin, anti-IgE, anti-PSA, and IgE aptamer are more preferable.

There are no particular restrictions on the method for fixing the bio-related substance to the semiconductor layer, but examples thereof include a method for directly adsorbing the bio-related substance to the CNT surface, or using a reaction or interaction between the bio-related substance and a functional group contained in the semiconductor layer, that is, a functional group such as a hydroxy group, a carboxy group, an amino group, a mercapto group, a sulfo group, a phosphonic acid group, an organic or inorganic salt thereof, a formyl group, a maleimide group, or a succinimide group.

From the viewpoint of the strength of the fixing, it is preferable to utilize the reaction or interaction between the bio-related substance and the functional group contained in the semiconductor layer. For example, in the case where a bio-related substance includes an amino group, examples thereof include a carboxy group, an aldehyde group and a succinimide group. In the case of a thiol group, examples include a maleimide group and the like.

Among the above, in the case of a carboxy group or an amino group, a reaction or interaction with the bio-related substance is easily utilized and the bio-related substance is easily fixed to the semiconductor layer. Therefore, the functional group contained in the semiconductor layer is preferably a carboxy group, a succinimide ester group or an amino group.

The reaction or interaction is not particularly limited. Specific examples thereof include a chemical bond, a hydrogen bond, an ionic bond, a coordinate bond, an electrostatic force, a van der Waals force, and the like. It may be selected appropriately according to the kind of the functional group and the chemical structure of the bio-related substance. In addition, as necessary, a part of the functional group and/or bio-related substance may be converted into another appropriate functional group and then fixed. Furthermore, a linker such as terephthalic acid may be utilized between the functional group and the bio-related substance.

The process of fixing is not particularly limited. Examples thereof include a process in which a solution containing a bio-related substance is added to a solution containing CNT or a semiconductor layer and the bio-related substance is fixed while applying healing, cooling, vibration, or the like as necessary and then, the excess components are removed by washing or drying.

In the semiconductor element of the present invention, examples of the combination of the functional group contained in the semiconductor layer/bio-related substance include carboxy group/glucose oxidase, carboxy group/T-PSA-mAb (monoclonal antibody for prostate specific antigen), carboxy group/hCG-mAb (human chorionic gonadotropin antibody), carboxy group/artificial oligonucleotide (IgE (immunoglobulin E) aptamer), carboxy group/anti-IgE, carboxy group/IgE, carboxy group/amino group terminal RNA (HIV-1 (human immunodeficiency virus) receptor), carboxy group/natriuretic peptide receptor, amino group/ RNA (HIV-1 antibody receptor), amino group/biotin, mercapto group/T-PSA-mAb, mercapto group/hCG-mAb, sulfo group/T-PSA-mAb, sulfo group/hCG-mAb, phosphonic acid group/T-PSA-mAb, phosphonic acid group/hCG-mAb, aldehyde group/oligonucleotide, aldehyde group/anti AFP polyclonal antibody (antibody for human tissue immunostaining), maleimide group/cysteine, succinimide ester/ streptavidin, sodium carboxylate/glucose oxidase, carboxy group/anti-troponin T (troponin T antibody), carboxy group/ anti-CK-MB (creatinine kinase MB antibody), carboxy group/anti-PIVKA-II (protein induced by vitamin K absence or antagonist-II antibody), carboxy group/anti-CA15-3, carboxy group/anti-CEA (carcinoembryonic antigen antibody)), carboxy group/anti-CYFRA (cytokeratin 19 fragment antibody), carboxy group/anti-p53 (p53 protein antibody), and the like.

In addition, in the case where the bio-related substance contains a functional group, it is preferably used as an organic compound containing the functional group. Specific examples thereof include IgE aptamers, biotin, streptavidin, natriuretic peptide receptor, avidin, T-PSA-mAb, hCG-mAb, IgE, amino group terminal RNA, RNA, anti AFP polyclonal antibody, cysteine, anti-troponin T, anti-CK-MB, anti-PIVKA-II, anti-CA15-3, anti-CEA, anti-CYFRA, anti-p53, and the like.

(Sensor)

The sensor of the present invention contains the semiconductor element described above. That is, the sensor contains a semiconductor element containing an organic film, a first electrode, a second electrode, and a semiconductor layer, in which the first electrode, the second electrode and the semiconductor layer are formed on the organic film, the semiconductor layer is arranged between the first electrode and the second electrode, the semiconductor layer contains at least one kind selected from organic semiconductors, carbon nanotubes and graphenes, and the organic film has a water contact angle of 5° or more and 50° or less. Then, it is preferable that the sensor of the present invention have a bio-related substance which selectively interacts with a substance to be sensed in the semiconductor layer.

In the sensor which contains the semiconductor element formed as illustrated in FIG. 1A and FIG. 1B, when a substance to be sensed or a solution, gas or solid containing the substance is arranged in the vicinity of the semiconductor layer 4, the current value flowing between the first electrode and the second electrode or the electric resistance value changes. The substance to be sensed can be detected by measuring the change.

In addition, also in the sensor containing the semiconductor element formed as illustrated in FIG. 3, when a substance to be sensed or a solution, gas or solid containing the substance is arranged in the vicinity of the semiconductor layer 4, the current value flowing between the first electrode 2 and the second electrode 3, that is, the semiconductor layer 4, changes. The substance to be sensed can be detected by measuring the change.

In addition, in the sensor containing the semiconductor element of FIG. 3, the value of the current flowing through the semiconductor layer 4 can be controlled by the voltage of the gate electrode 6. Therefore, when measuring the current value flowing between the first electrode 2 and the second electrode 3 while changing the voltage of the gate electrode 6, a two-dimensional graph (I-V graph) is obtained.

The substance to be sensed may be detected by using a part or all of the characteristic values, or the substance to be sensed may be detected by using the ratio between the maximum current and the minimum current, that is, the on/off ratio. In addition, known electrical characteristics obtained from the semiconductor element, such as the resistance value, impedance, mutual conductance, and capacitance may be used.

The substance to be sensed may be used singly, or may be mixed with other substances or solvents. The substance to be sensed or a solution, gas or solid containing the substance is arranged in the vicinity of the semiconductor layer 4. As described above, due to the interaction between the semiconductor layer 4 and the substance to be sensed, the electric characteristics of the semiconductor layer 4 change, which is detected as a change in any of the electric signals described above.

In addition, the sensor of the present invention contains an organic film and has a water contact angle with respect to the organic film of 5° or more and 50° or less, thereby suppressing adhesion of the substance to be sensed to portions other than the sensing portion and making detection of the substance to be sensed easy.

In the case where the semiconductor layer has a bio-related substance which selectively interacts with a substance to be sensed, a ratio of the molar content A of the bio-related substance contained in the semiconductor layer and the molar content B of the bio-related substance contained in the organic film is preferably (A):(B)=80:20 to 100:0. The ratio is more preferably (A):(B)=90:10 to 100:0.

(A):(B) being within this range makes it possible to fix the substance to be sensed more to the semiconductor layer and to more easily detect the substance to be sensed. On the other hand, in the case where (A):(B)=50:50 or the like, since the substance to be sensed tends to be also fixed to portions other than the semiconductor layer, it is difficult to detect the substance to be sensed and the sensitivity is lowered.

The molar content of the bio-related substance can be determined by a method of (1) fluorescently labeling the target substance of the bio-related substance, (2) fixing the fluorescently labeled target substance on the sensor, (3) washing away the excess target substance with a solvent, and (4) observing the fluorescence intensity with a fluorescence microscope. For example, it is possible to react fluorescein isothiocyanate (FITC) with a target protein substance for use.

The substance to be sensed by the sensor of the present invention is not particularly limited, but examples thereof include enzymes, antigens, antibodies, haptens, peptides, oligopeptides, polypeptides (proteins), hormones, nucleic acids, oligonucleotides, saccharides such as sugars, oligosaccharides and polysaccharides, low molecular weight compounds, inorganic substances and composites thereof, viruses, bacteria, cells, living tissues and substances forming them, and the like. They can bring about a change in the electrical characteristics of the semiconductor layer in the sensor of the present invention through a reaction or interaction with either of a functional group such as a hydroxy group, a carboxy group, an amino group, a mercapto group, a sulfo group, a phosphonic acid group, an organic or inorganic salt thereof, a formyl group, a maleimide group, and a succinimide group, or a bio-related substance.

The low molecular weight compound is not particularly limited. Examples thereof include a compound which is gaseous at an ambient temperature and pressure, such as ammonia or methane, or a solid compound such as uric acid, which are emitted from a living body. A solid compound such as uric acid is preferable.

Among these, sugars, proteins, viruses, and bacteria are preferable as the substance to be sensed. Examples of sugars include glucose and the like. Examples of proteins include PSA, hCG, IgE, BNP, NT-proBNP, AFP, CK-MB, PIVKA II, CA15-3, CYFRA, anti-p53, troponin T, procalcitonin, HbA1c, apolipoprotein, C reactive protein (CRP), and the like. Examples of viruses include HIV, influenza virus, hepatitis B virus, hepatitis C virus, and the like. Examples of bacteria include *Chlamydia, Staphylococcus aureus*, Enterohemorrhagic *Escherichia coli*, and the like.

In the sensor of the present invention, examples of the combination of bio-related substance/substance to be sensed include glucose oxidase/β-D-glucose, T-PSA-mAb (monoclonal antibody for prostate specific antigen)/PSA (prostate specific antigen), hCG-mAb (human chorionic gonadotropin antibody)/hCG (human chorionic gonadotropin), artificial oligonucleotide/IgE (immunoglobulin E), diisopropyl carbodiimide/IgE, anti-IgE/IgE, amino group terminal RNA/HIV-1 (human immunodeficiency virus), natriuretic peptide receptor/BNP (brain natriuretic peptide), RNA/HIV-1, biotin/avidin, oligonucleotide/nucleic acid, anti-AFP polyclonal antibody (antibody for human tissue immunostaining)/α fetoprotein, streptavidin/biotin, avidin/biotin, anti-troponin T (troponin T antibody)/troponin T, anti-CK-MB (creatinine kinase MB antibody)/CK-MB (creatinine kinase MB), anti-PIVKA-II (protein induced by vitamin K absence or antagonist-II antibody)/PIVKA-II (protein induced by vitamin K absence or antagonist-II), anti-CA15-3/CA15-3, anti-CEA (carcinoembryonic antigen antibody)/CEA (carcinoembryonic antigen), anti-CYFRA (cytokeratin 19 fragment antibody)/CYFRA (cytokeratin 19 fragment), anti-p53 (p53 protein antibody)/p53 (p53 protein), and the like.

The sample containing the substance to be sensed is not particularly limited and examples thereof include exhalation, sweat, urine, saliva, stool, blood, serum, plasma, a buffer solution, and the like, and sweat, urine, saliva, blood, serum, plasma, and a buffer solution are preferable.

EXAMPLES

A more specific description of the present invention will be given below based on Examples. Note that the present invention is not limited to the following Examples.

The CNTs used are as follows.

CNT 1: manufactured by CNI, single layer CNT, semiconductor type CNT purity>95%

CNT 2: manufactured by Meijo Nano Carbon Co., Ltd., single layer CNT, semiconductor type CNT purity 90%

CNT 3: manufactured by Meijo Nano Carbon Co., Ltd., single layer CNT, semiconductor type CNT purity 80%

Abbreviations used among the used compounds are explained below.

P3HT: poly-3-hexylthiophene
PBS: phosphate buffered saline
BNP: brain natriuretic peptide
BSA: *bovine* serum albumin
IgE: immunoglobulin E
PSA: prostate specific antigen
o-DCB: o-dichlorobenzene
DMF: dimethylformamide
DMSO: dimethylsulfoxide
EDC: 1-ethyl-3-(3-dimethylaminopropyl)carbodiimide, hydrochloride The water contact angle with respect to the organic film and the substrate in each Example and Comparative Example was measured according to the static method in "Method for Testing Wettability of Substrate Glass Surface" specified in JIS R3257: 1999.

The molar content ratios (A) and (B) in each Example and Comparative Example were measured by (1) fluorescently labeling the target substance of the bio-related substance, (2) fixing the fluorescently labeled target substance on the sensor, (3) washing away the excess target substance with a solvent, and (4) observing the fluorescence intensity with a fluorescence microscope.

Example 1

(1) Preparation of Semiconductor Solution

Into 15 ml of chloroform were added 1.5 mg of CNT 1 and 1.5 mg of P3HT, followed by ultrasonic agitation for 30 minutes by using an ultrasonic homogenizer (VCX-500, manufactured by Tokyo Rikakikai Co., Ltd.) at an output of 250 W while cooling with ice, to thereby obtain a CNT dispersion liquid A (concentration of CNT composite with respect to solvent: 0.1 g/l).

Next, a semiconductor solution for forming a semiconductor layer was prepared. The CNT dispersion liquid A described above was filtered by using a membrane filter (pore size 10 μm, diameter 25 mm, Omnipore membrane, manufactured by Millipore Corporation) to remove the CNT composite having a length of 10 μm or more. To 5 ml of the obtained filtrate was added 45 ml of o-DCB, to thereby obtain a semiconductor solution A (CNT composite concentration with respect to the solvent: 0.01 g/l).

(2) Preparation of Semiconductor Element

The semiconductor element illustrated in FIG. 2 was prepared. A glass substrate 5 (film thickness 0.7 mm) was subjected to an ultraviolet ozone treatment (a photo surface processor, PL30-200, manufactured by Sen Lights Corp.) for 30 minutes and immersed in a 10% by weight ethanol solution of a polyethylene glycol chain-containing silane coupling agent (SIH 6188, manufactured by Gelest, Inc., Inc.) for 1 hour. After washing with ethanol for 30 seconds, the resultant was dried at 120° C. for 30 minutes to form an organic film 1. On the organic film 1 were formed a first electrode 2 and a second electrode 3 by mask-depositing gold to be a thickness of 50 nm. The width (channel width) of the first electrode 2 and the second electrode 3 was 100 μm, and the interval (channel length) between the first electrode 2 and the second electrode 3 was 10 μm.

On the organic film 1 on which the electrodes were formed, 400 pl of the semiconductor solution A prepared by the method described in (1) above was dropped by using an ink jet apparatus (manufactured by Cluster Technology Co., Ltd.), to thereby form a semiconductor layer 4. The resultant was subjected to a heat treatment on a hot plate at 150° C. for 30 minutes under a nitrogen stream, to thereby obtain a semiconductor element A.

Next, the semiconductor layer 4 was immersed overnight at 4° C. in a 0.01 M PBS solution containing an anti-IgE (manufactured by Bethyl Laboratories, Inc.) at 100 ug/mL. Thereafter, the semiconductor layer 4 was thoroughly rinsed with 0.01 M PBS. Next, the semiconductor layer 4 was immersed for 2 hours in 5.0 mL of a 0.01 M PBS solution containing 5.0 mg BSA (manufactured by Wako Pure Chemical Industries, Ltd.). Thereafter, the semiconductor layer 4 was thoroughly rinsed with 0.01 M PBS, to thereby obtain a semiconductor element in which the semiconductor layer 4 is modified with an anti-IgE which is a bio-related substance which selectively interacts with a substance to be sensed and BSA which is a protective agent.

(3) Evaluation as Sensor

The semiconductor layer 4 of the prepared semiconductor element was immersed in 100 μl of 0.01 M PBS and the current value flowing between the first electrode 2 and the second electrode 3 was measured. For the measurement, a semiconductor characteristics evaluation system 4200-SCS model (manufactured by Keithley Instruments Co., Ltd.) was used. The measurement was performed with the voltage between the first electrode and the second electrode (Vsd) =−0.2 V and the voltage between the first electrode and the third electrode (Vg)=−0.6 V. To the 0.01M PBS in which the semiconductor layer 4 was immersed, 2.0 μl of a 5 μg/mL BSA-0.01 M PBS solution was added two minutes after the start of the measurement, 20 μl of a 5 μg/mL avidin (manufactured by Wako Pure Chemical Industries, Ltd.)-0.01 M PBS solution was added seven minutes after, and 20 μl of a 5 μg/mL IgE (manufactured by Yamasa Corporation)-0.01 M PBS solution was added twelve minutes after. The results are shown in FIG. 4. A current value decrease of 8.2% from the current value before addition was observed only when IgE was added.

Example 2

(1) Preparation of Semiconductor Element

The semiconductor element illustrated in FIG. 2 was prepared. A glass substrate 5 (film thickness 0.7 mm) was immersed for 1 hour in a 2% by weight ethanol solution of a phosphorylcholine group-containing polymer (Lipidure-CM5206, manufactured by NOF Corporation). The substrate was pulled up and dried at 50° C. for 30 minutes to form an organic film 1. The formation of the first electrode 2, the second electrode 3 and the semiconductor layer 4 on the organic film 1 and the modification of the semiconductor layer 4 were performed in the same manner as in Example 1, to thereby obtain a semiconductor element in which the semiconductor layer 4 is modified with an anti-IgE which is a bio-related substance which selectively interacts with a substance to be sensed and BSA which is a protective agent.

(2) Evaluation as Sensor

In order to evaluate the semiconductor element prepared above as a sensor, measurements were carried out in the same manner as in Example 1. A current value decrease of 8.0% from the current value before addition was observed only when IgE was added.

Example 3

(1) Preparation of Semiconductor Element

The organic film 1, the first electrode 2, the second electrode 3, and the semiconductor layer 4 were formed in the same manner as in Example 1 except that a 10% by weight ethanol solution of a silane coupling agent containing a 1,2-dihydroxyethyl group and a 1,2-dihydroxyethylene group (SIT8189, manufactured by Gelest, Inc.) was used in place of the polyethylene glycol chain-containing silane coupling agent, to thereby obtain a semiconductor element in which the semiconductor layer 4 is modified with an anti-IgE which is a bio-related substance which selectively interacts with a substance to be sensed and BSA which is a protective agent.

(2) Evaluation as Sensor

In order to evaluate the semiconductor element prepared above as a sensor, measurements were carried out in the same manner as in Example 1. A current value decrease of 8.1% from the current value before addition was observed only when IgE was added.

Example 4

(1) Preparation of Semiconductor Element

The semiconductor element A was prepared in the same manner as in Example 1. Next, the semiconductor layer 4 was immersed for 1 hour in a 1.0 mL DMF (Wako Pure Chemical Industries, Ltd.) solution containing 6.0 mg of pyrenebutanoic acid succinimide ester (manufactured by AnaSpec, Inc.). Thereafter, the semiconductor layer 4 was thoroughly rinsed with DMF and DMSO (manufactured by Wako Pure Chemical Industries, Ltd.). Next, the semiconductor layer 4 was immersed overnight in a 1.0 mL DMSO solution containing 10 μL of diethylene glycol bis(3-aminopropyl)ether (manufactured by Tokyo Chemical Industry Co., Ltd.). Thereafter, the semiconductor layer 4 was thoroughly rinsed with DMSO and pure water. Next, the semiconductor layer 4 was immersed overnight in 1.0 mL of a 0.01 M PBS solution containing 1.0 mg of biotin N-hydroxysulfosuccinimide ester. Thereafter, the semiconductor layer 4 was thoroughly rinsed with pure water, to thereby obtain a semiconductor element in which biotin was fixed to the semiconductor layer 4. Next, the semiconductor layer 4 was immersed in 5.0 mL of a 0.01 M PBS solution containing 5.0 mg BSA for 2 hours. Thereafter, the semiconductor layer 4 was thoroughly rinsed with 0.01 M PBS, to thereby obtain a semiconductor element in which the semiconductor layer 4 was modified with biotin which is a bio-related substance which selectively interacts with a substance to be sensed and BSA which is a protective agent.

(2) Evaluation as Sensor

In order to evaluate the semiconductor element prepared above as a sensor, measurements were carried out. To the 0.01M PBS in which the semiconductor layer 4 was immersed, 20 μl of a 5 μg/mL BSA-0.01 M PBS solution was added two minutes after the start of the measurement. 20 μl of a 5 μg/mL IgE-0.01 NI PBS solution was added seven minutes after, and 20 μl of a 5 μg/mL avidin-0.01 M PBS solution was added twelve minutes after. A current value decrease of 7.9% from the current value before addition was observed only when avidin was added.

Example 5

(1) Preparation of Semiconductor Element

A semiconductor element was prepared in the same manner as in Example 1 except that an anti-PSA (manufactured by Mikuri Immunolab) was used in place of the anti-IgE, to thereby obtain a semiconductor element in which the semiconductor layer 4 was modified with an anti-PSA which is a bio-related substance which selectively interacts with a substance to be sensed and BSA which is a protective agent.

(2) Evaluation as Sensor

In order to evaluate the semiconductor element prepared above as a sensor, measurement was carried out. To the 0.01M PBS in which the semiconductor layer 4 was immersed, 20 μl of a 5 μg/mL BSA-0.01 M PBS solution was added two minutes after the start of the measurement, 20 μl of a 5 μg/mL IgE-0.01 M PBS solution was added seven minutes after, and 20 μl of a 5 μg/mL PSA (manufactured by R&D Systems, Inc.)-0.01 M PBS solution was added twelve minutes after. A current value decrease of 8.0% from the current value before addition was observed only when PSA was added.

Example 6

(1) Preparation of Semiconductor Element

A glass substrate 5 (film thickness 0.7 mm) was subjected to an ultraviolet ozone treatment for 30 minutes and immersed for 1 hour in a 10% by weight aqueous solution of a carboxy group-containing silane coupling agent (SIT8402, manufactured by Gelest, Inc.). After washing with purified water for 30 seconds, drying was carried out at 120° C. for 30 minutes. Next, the resultant was immersed for 2 hours in a 5.0 mL of a PBS solution (adjusted to pH=5.5) containing 10 mg of EDC (manufactured by Dojindo Molecular Technologies, Inc.). The resultant was washed with PBS and immersed in 10 mL of a PBS (adjusted to pH=5.5) solution containing 0.1 mL of 2-(2-aminoethoxy) ethanol for 2 hours at 37° C. The resultant was washed with purified water, to thereby obtain an organic film 1. Due to this, an organic film containing a hydroxyethyl group as a structure was formed. The formation of the first electrode 2, the second electrode 3 and the semiconductor layer 4 on the organic film 1 and the modification of the semiconductor layer 4 were performed in the same manner as in Example 1, to thereby obtain a semiconductor element in which the semiconductor layer 4 is modified with an anti-IgE which is a bio-related substance which selectively interacts with a substance to be sensed and BSA which is a protective agent.

(2) Evaluation as Sensor

In order to evaluate the semiconductor element prepared above as a sensor, measurement was carried out in the same manner as Example 1. A current value decrease of 7.5% from the current value before addition was observed only when IgE was added.

Example 7

(1) Preparation of Polymer Solution for Organic Film

In 400.62 g of propylene glycol monobutyl ether (boiling point 170° C.) were dissolved 61.41 g (0.45 mol) of methyltrimethoxysilane, 12.35 g (0.05 mol) of β-(3,4-epoxycyclohexyl)ethyltrimethoxysilane, 99.33 g (0.5 mol) of phenyltrimethoxysilane, 50.08 g (0.5 mol) of polyethylene glycol triethoxysilane, and 20.01 g of silica particles (particle size 50 nm), and thereto were further added 54.90 g of water and 0.864 g of phosphoric acid while stirring. The obtained solution was heated at a bath temperature of 105° C. for 2 hours and the internal temperature was raised to 90° C. to distill out the component mainly composed of the by-product methanol. Subsequently, the mixture was heated at a bath temperature of 130° C. for 2 hours and the internal temperature was raised to 118° C. to distill out the component mainly composed of water and propylene glycol monobutyl ether, and then cooled to room temperature, to thereby obtain a polymer solution A with a solid content concentration of 40.2% by weight. The obtained polymer solution A was weighed out 50 g and mixed with 20.6 g of propylene glycol monobutyl ether (boiling point 170° C.), followed by stirring at room temperature for 2 hours, to thereby obtain a polymer solution B (solid content concentration of 28.5% by weight).

(2) Preparation of Semiconductor Element

The polymer solution B prepared by the method described in (1) above was applied by spin coating (800 rpm×20 seconds) on a glass substrate and heat-treated at 120° C. for 5 minutes, and then the insulating material solution A was again applied by spin coating (800 rpm×20 seconds), and a heat treatment at 200° C. was performed thereon for 30 minutes under a nitrogen stream, to thereby form an organic film 1 having a film thickness of 400 nm. The formation of the first electrode 2, the second electrode 3 and the semiconductor layer 4 on the organic film 1 and the modification of the semiconductor layer 4 were performed in the same manner as in Example 1, to thereby obtain a semiconductor element in which the semiconductor layer 4 is modified with an anti-IgE which is a bio-related substance which selectively interacts with a substance to be sensed and BSA which is a protective agent.

(3) Evaluation as Sensor

In order to evaluate the semiconductor element prepared above as a sensor, measurement was carried out in the same manner as Example 1. A current value decrease of 7.6% from the current value before addition was observed only when IgE was added.

Example 8

(1) Preparation of Polymer Solution for Organic Film

In 450.32 g of propylene glycol monobutyl ether (boiling point 170° C.) were dissolved 61.41 g (0.45 mol) of methyltrimethoxysilane, 12.35 g (0.05 mol) of β-(3,4-epoxycyclohexyl)ethyltrimethoxysilane, 99.33 g (0.5 mol) of phenyltrimethoxysilane, 50.08 g (0.5 mol) of polyethylene glycol triethoxysilane, and 50.18 g of silica particles (particle size 50 nm), and thereto were further added 54.10 g of water and 0.971 g of phosphoric acid while stirring. The obtained solution was heated at a bath temperature of 105° C. for 2 hours and the internal temperature was raised to 90° C. to distill out the component mainly composed of the by-product methanol. Subsequently, the mixture was heated at a bath temperature of 130° C. for 2 hours and the internal temperature was raised to 118° C. to distill out the component mainly composed of water and propylene glycol monobutyl ether, and then cooled to room temperature, to thereby obtain a polymer solution A with a solid content concentration of 39.0% by weight. The obtained polymer solution A was weighed out 50 g and mixed with 20.1 g of propylene glycol monobutyl ether (boiling point 170° C.), followed by stirring at room temperature for 2 hours, to thereby obtain a polymer solution B (solid content concentration of 27.8% by weight).

(2) Preparation of Semiconductor Element

The polymer solution B prepared by the method described in (1) above was applied by spin coating (800 rpm×20 seconds) on a glass substrate and heat-treated at 120° C. for 5 minutes, and then the insulating material solution A was again applied by spin coating (800 rpm×20 seconds), and a heat treatment at 200° C. was performed thereon for 30 minutes under a nitrogen stream, to thereby form an organic film 1 having a film thickness of 400 nm. The formation of the first electrode 2, the second electrode 3 and the semiconductor layer 4 on the organic film 1 and the modification of the semiconductor layer 4 were performed in the same manner as in Example 1, to thereby obtain a semiconductor element in which the semiconductor layer 4 is modified with an anti-IgE which is a bio-related substance which selectively interacts with a substance to be sensed and BSA which is a protective agent.

(3) Evaluation as Sensor

In order to evaluate the semiconductor element prepared above as a sensor, measurement was carried out in the same manner as Example 1. A current value decrease of 7.4% from the current value before addition was observed only when IgE was added.

Example 9

(1) Preparation of Polymer Solution for Organic Film

In 450.32 g of propylene glycol monobutyl ether (boiling point 170° C.) were dissolved 61.41 g (0.45 mol) of methyltrimethoxysilane, 12.35 g (0.05 mol) of β-(3,4-epoxycyclohexyl)ethyltrimethoxysilane, 99.33 g (0.5 mol) of phenyltrimethoxysilane (0.5 mol), and 50.08 g (0.5 mol) of polyethylene glycol triethoxysilane, and thereto were further added 54.10 g of water and 0.971 g of phosphoric acid while stirring. The obtained solution was heated at a bath temperature of 105° C. for 2 hours and the internal temperature was raised to 90° C. to distill out the component mainly composed of the by-product methanol. Subsequently, the mixture was heated at a bath temperature of 130° C. for 2 hours and the internal temperature was raised to 118° C. to distill out the component mainly composed of water and propylene glycol monobutyl ether, and then cooled to room temperature, to thereby obtain a polymer solution A with a solid content concentration of 40.1% by weight. The obtained polymer solution A was weighed out 50 g and mixed with 20.1 g of propylene glycol monobutyl ether (boiling point 170° C.), followed by stirring at room temperature for 2 hours, to thereby obtain a polymer solution B (solid content concentration of 28.6% by weight).

(2) Preparation of Semiconductor Element

The polymer solution B prepared by the method described in (1) above was applied by spin coating (800 rpm×20 seconds) on a glass substrate and heat-treated at 120° C. for 5 minutes, and then the insulating material solution A was again applied by spin coating (800 rpm×20 seconds), and a heat treatment at 200° C. was performed thereon for 30 minutes under a nitrogen stream, to thereby form an organic film 1 having a film thickness of 400 nm. Due to this, an organic film containing polyethylene glycol chain and polysiloxane as a structure was formed. The formation of the first electrode 2, the second electrode 3 and the semiconductor layer 4 on the organic film 1 and the modification of the semiconductor layer 4 were performed in the same manner as in Example 1, to thereby obtain a semiconductor element in which the semiconductor layer 4 is modified with an anti-IgE which is a bio-related substance which selectively interacts with a substance to be sensed and BSA which is a protective agent.

(3) Evaluation as Sensor

In order to evaluate the semiconductor element prepared above as a sensor, measurement was carried out in the same manner as Example 1. A current value decrease of 8.8% from the current value before addition was observed only when IgE was added.

Example 10

(1) Preparation of Semiconductor Element

A glass substrate 5 (film thickness 0.7 mm) was subjected to an ultraviolet ozone treatment for 30 minutes and immersed for 1 hour in a 2.5% by weight hexane solution of 3-aminopropyltriethoxysilane (manufactured by Tokyo Chemical Industry Co., Ltd.). After washing with hexane for 30 seconds, drying was carried out at 120° C. for 30 minutes.

On the substrate, a polyvinyl alcohol reagent (BIOSURFINE-AWP, Toyo Gosei Co., Ltd.) was applied by spin coating (1,500 rpm×30 seconds) and heated and dried at 70° C. for 15 minutes. Subsequently, the resultant was exposed by using a parallel light mask aligner (PLA-501F, manufactured by Canon Inc.) and then, washed with water and heated and dried at 120° C. for 30 minutes, to thereby prepare an organic film 1 having a film thickness of 1 μm. In this step, BIOSURFINE-AWP, which is a photocrosslinkable polyvinyl alcohol reagent, was cured to form a cross-linked body of polyvinyl alcohol. The formation of the first electrode 2, the second electrode 3 and the semiconductor layer 4 on the organic film 1 and the modification of the semiconductor layer 4 were performed in the same manner as in Example 1, to thereby obtain a semiconductor element in which the semiconductor layer 4 is modified with an anti-IgE which is a bio-related substance which selectively interacts with a substance to be sensed and BSA which is a protective agent.

(3) Evaluation as Sensor

In order to evaluate the semiconductor element prepared above as a sensor, measurement was carried out in the same manner as Example 1. A current value decrease of 9.0% from the current value before addition was observed only when IgE was added.

Example 11

(1) Preparation of Semiconductor Element

A semiconductor element was prepared in the same manner as in Example 9 except that CNT 2 was used in place of CNT 1, to thereby obtain a semiconductor element in which the semiconductor layer 4 is modified with an anti-IgE which is a bio-related substance which selectively interacts with a substance to be sensed and BSA which is a protective agent.

(2) Evaluation as Sensor

In order to evaluate the semiconductor element prepared above as a sensor, measurement was carried out in the same manner as Example 1. A current value decrease of 7.7% from the current value before addition was observed only when IgE was added.

Example 12

(1) Preparation of Semiconductor Element

A semiconductor element was prepared in the same manner as in Example 9 except that CNT 3 was used in place of CNT 1, to thereby obtain a semiconductor element in which the semiconductor layer 4 is modified with an anti-IgE which is a bio-related substance which selectively interacts with a substance to be sensed and BSA which is a protective agent.

(2) Evaluation as Sensor

In order to evaluate the semiconductor element prepared above as a sensor, measurement was carried out in the same manner as Example 1. A current value decrease of 5.2% from the current value before addition was observed only when IgE was added.

Example 13

(1) Preparation of Semiconductor Solution

Into 15 ml of water were added 1.5 mg of CNT 1 and 4.5 mg of sodium alginate, followed by ultrasonic agitation for 60 minutes by using an ultrasonic homogenizer at an output of 250 W while cooling with ice, to thereby obtain a CNT dispersion liquid B (CNT composite concentration with respect to solvent: 0.1 g/l).

Next, a semiconductor solution for forming a semiconductor layer was prepared. The CNT dispersion liquid A described above was filtered by using a membrane filter (pore size 10 μm, diameter 25 mm, Omnipore membrane, manufactured by Millipore Corporation) to remove the CNT composite having a length of 10 μm or more. To 5 ml of the obtained filtrate was added 5 ml of water, to thereby obtain a semiconductor solution B (CNT composite concentration with respect to solvent: 0.01 g/l).

(2) Preparation of Semiconductor Element

A semiconductor element was prepared in the same manner as in Example 9 except that the semiconductor solution B was used in place of the semiconductor solution A, to thereby obtain a semiconductor element in which the semiconductor layer 4 is modified with an anti-IgE which is a bio-related substance which selectively interacts with a substance to be sensed and BSA which is a protective agent.

(3) Evaluation as Sensor

In order to evaluate the semiconductor element prepared above as a sensor, measurement was carried out in the same manner as Example 1. A current value decrease of 6.2% from the current value before addition was observed only when IgE was added.

Example 14

(1) Preparation of Semiconductor Element

A semiconductor element was prepared in the same manner as in Example 13 except that polystyrene sulfonic acid was used in place of sodium alginate, to thereby obtain a semiconductor element in which the semiconductor layer 4 is modified with an anti-IgE which is a bio-related substance which selectively interacts with a substance to be sensed and BSA which is a protective agent.

(2) Evaluation as Sensor

In order to evaluate the semiconductor element prepared above as a sensor, measurement was carried out in the same manner as Example 1. A current value decrease of 6.3% from the current value before addition was observed only when IgE was added.

Example 15

(1) Preparation of Semiconductor Solution

A CNT composite was prepared in the same manner as in Example 9 except that 1.5 mg of the polymer of Formula (46) was used in place of 1.5 mg of P3HT, to thereby obtain a CNT dispersion liquid C and a semiconductor solution C.

(2) Preparation of Semiconductor Element

A semiconductor element was prepared in the same manner as in Example 9 except that the semiconductor solution C was used in place of the semiconductor solution A. Next, the semiconductor layer 4 was immersed overnight at 4° C. in a 0.01 M PBS solution containing an IgE aptamer (manufactured by Fasmac) at 100 ug/mL. Thereafter, the semiconductor layer 4 was thoroughly rinsed with 0.01 M PBS. Next, the semiconductor layer 4 was immersed for 2 hours in 5.0 mL of a 0.01 M PBS solution containing 5.0 mg BSA. Thereafter, the semiconductor layer 4 was thoroughly rinsed with 0.01 M PBS, to thereby obtain a semiconductor element in which the semiconductor layer 4 is modified with an IgE aptamer which is a bio-related substance which selectively interacts with a substance to be sensed and BSA which is a protective agent.

(3) Evaluation as Sensor

In order to evaluate the semiconductor element prepared above as a sensor, measurement was carried out in the same manner as Example 1. A current value decrease of 8.9% from the current value before addition was observed only when IgE was added.

Example 16

(1) Preparation of Semiconductor Element

The formation of the organic film 1 and the formation of the first electrode 2 and the second electrode 3 on the organic film 1 were performed in the same manner as in Example 9. In a glovebox under a nitrogen atmosphere, an o-DCB solution containing polythiophene polymer (46) at 1% by weight was applied by spin coating (1,000 rpm×90 seconds) on the organic film 1 on which the electrodes were formed, and a heat treatment at 120° C. was performed thereon for 5 minutes, to thereby form a semiconductor layer 4. Next, the semiconductor layer 4 was immersed overnight at 4° C.

in a 0.01 M PBS solution containing an IgE aptamer (manufactured by Fasmac) at 100 ug/mL. Thereafter, the semiconductor layer 4 was thoroughly rinsed with 0.01 M PBS. Next, the semiconductor layer 4 was immersed for 2 hours in 5.0 mL of a 0.01 M PBS solution containing 5.0 mg BSA. Thereafter, the semiconductor layer 4 was thoroughly rinsed with 0.01 M PBS, to thereby obtain a semiconductor element in which the semiconductor layer 4 was modified with an IgE aptamer which is a bio-related substance which selectively interacts with a substance to be sensed and BSA which is a protective agent.

(2) Evaluation as Sensor

In order to evaluate the semiconductor element prepared above as a sensor, measurement was carried out in the same manner as Example 1. A current value decrease of 1.8% from the current value before addition was observed only when IgE was added.

Example 17

(1) Preparation of Semiconductor Element

The formation of the organic film 1 and the formation of the first electrode 2 and the second electrode 3 on the organic film 1 were performed in the same manner as in Example 9. A solution of 1% by weight graphene (manufactured by Sigma. Aldrich, Inc.) was applied by spin coating (1,000 rpm×30 seconds) on the organic film 1 on which the electrode was formed, and a heat treatment at 120° C. was performed thereon for 5 minutes, to thereby form a semiconductor layer 4. Next, the semiconductor layer 4 was immersed for 5 hours in 1.0 mL of a methanol (manufactured by Wako Pure Chemical Industries, Ltd.) solution containing 6.0 mg of pyrenebutanoic acid succinimide ester (manufactured by AnaSpec, Inc.). Thereafter, the semiconductor layer 4 was thoroughly rinsed with a solution in which methanol and water were mixed at the same volume. Next, the semiconductor layer 4 was immersed overnight at 4° C. in a 0.01 M PBS solution containing an IgE aptamer (manufactured by Fasmac) at 100 ug/mL. Thereafter, the semiconductor layer 4 was thoroughly rinsed with 0.01 M PBS. Next, the semiconductor layer 4 was immersed for 2 hours in 5.0 mL of a 0.01 M PBS solution containing 5.0 mg BSA. Thereafter, the semiconductor layer 4 was thoroughly rinsed with 0.01 M PBS, to thereby obtain a semiconductor element in which the semiconductor layer 4 was modified with an IgE aptamer which is a bio-related substance which selectively interacts with a substance to be sensed and BSA which is a protective agent.

(2) Evaluation as Sensor

In order to evaluate the semiconductor element prepared above as a sensor, measurement was carried out in the same manner as Example 1. A current value decrease of 4.0% from the current value before addition was observed only when IgE was added.

Comparative Example 1

(1) Preparation of Semiconductor Element

A semiconductor element was prepared in the same manner as in Example 1 except that the glass substrate 5 was not subjected to ultraviolet ozone treatment and the organic film 1 was not formed, to thereby obtain a semiconductor element in which the semiconductor layer 4 is modified with an anti-IgE which is a bio-related substance which selectively interacts with a substance to be sensed and BSA which is a protective agent.

(2) Evaluation as Sensor

In order to evaluate the semiconductor element prepared above as a sensor, measurement was carried out in the same manner as Example 1. To the 0.01M PBS in which the semiconductor layer 4 was immersed, 20 µl of a 5 µg/mL BSA-0.01 M PBS solution was added two minutes after the start of the measurement, 20 µl of a 5 µg/mL avidin-0.01 M PBS solution was added seven minutes after, and 20 µl of a 5 µg/mL, IgE-0.01 M PBS solution was added twelve minutes after. A current value decrease of 0.2% from the current value before addition was observed only when IgE was added. The amount of decrease in the current value was small and the sensitivity was low.

Comparative Example 2

(1) Preparation of Polymer Solution for Organic Film

In 203.36 g of propylene glycol monobutyl ether (boiling point 170° C.) were dissolved 61.29 g (0.45 mol) of methyltrimethoxysilane, 12.31 g (0.05 mol) of β-(3,4-epoxycyclohexyl)ethyltrimethoxysilane and 99.15 g (0.5 mol) of phenyltrimethoxysilane, and thereto were further added 54.90 g of water and 0.864 g of phosphoric acid while stirring. The obtained solution was heated at a bath temperature of 105° C. for 2.0 hours and the internal temperature was raised to 90° C. to distill out the component mainly composed of the by-product methanol. Subsequently, the mixture was heated at a bath temperature of 130° C. for 2.0 hours and the internal temperature was raised to 118° C. to distill out the component mainly composed of water and propylene glycol monobutyl ether, and then cooled to room temperature, to thereby obtain a polymer solution A with a solid content concentration of 26.0% by weight. The obtained polymer solution A was weighed out 50 g and mixed with 16.6 g of propylene glycol monobutyl ether (boiling point 170° C.), followed by stirring at room temperature for 2 hours, to thereby obtain a polymer solution B (solid content concentration of 19.5% by weight).

(2) Preparation of Semiconductor Element

The polymer solution B prepared by the method described in (1) above was applied by spin coating (800 rpm×20 seconds) on a glass substrate and heat-treated at 120° C. for 5 minutes, and then the insulating material solution A was again applied by spin coating (800 rpm×20 seconds), and a heat treatment at 200° C. was performed thereon for 30 minutes under a nitrogen stream, to thereby form an organic film 1 having a film thickness of 400 nm. The formation of the first electrode 2, the second electrode 3 and the semiconductor layer 4 on the organic film 1 and the modification of the semiconductor layer 4 were performed in the same manner as in Example 1 except that the film A was not subjected to ultraviolet ozone treatment, to thereby prepare a semiconductor element to obtain a semiconductor element in which the semiconductor layer 4 is modified with an anti-IgE and BSA.

(3) Evaluation as Sensor

In order to evaluate the semiconductor element prepared above as a sensor, measurement was carried out in the same manner as Example 1. To the 0.01M PBS in which the semiconductor layer 4 was immersed, 20 µl of a 5 µg/mL BSA-0.01 M PBS solution was added two minutes after the start of the measurement, 20 µl of a 5 µg/mL avidin-0.01 M PBS solution was added seven minutes after, and 20 µl of a 5 µg/mL IgE-0.01 M PBS solution was added twelve minutes after. A current value decrease of 0.01 that is, 0.2% from the current value before addition was observed only when IgE was added. The amount of decrease in the current value was small and the sensitivity was low.

Comparative Example 3

(1) A semiconductor element was prepared in the same manner as in Example 1 except that the organic film 1 was not formed, to thereby obtain a semiconductor element in which the semiconductor layer 4 is modified with an anti-IgE which is a bio-related substance which selectively interacts with a substance to be sensed and BSA which is a protective agent.

(2) Evaluation as Sensor

In order to evaluate the semiconductor element prepared above as a sensor, measurement was carried out in the same manner as Example 1. To the 0.01M PBS in which the semiconductor layer 4 was immersed, 20 μl of a 5 μg/mL BSA-0.01 M PBS solution was added two minutes after the start of the measurement, 20 μl of a 5 μg/mL avidin-0.01 M PBS solution was added seven minutes after, and 20 μl of a 5 μg/mL IgE-0.01 M PBS solution was added twelve minutes after. A current value decrease of 0.3% from the current value before addition was observed only when IgE was added. The amount of decrease in the current value was small and the sensitivity was low.

The results of each Example and Comparative Example are summarized in Table 1.

TABLE 1

| | Organic film | Semiconductor material | Water contact angle of organic film (°) | Substrate | Water contact angle of substrate (°) | Structure included in organic film |
|---|---|---|---|---|---|---|
| Ex. 1 | Yes | CNT | 44 | Glass | — | Polyethylene glycol chain |
| Ex. 2 | Yes | CNT | 47 | Glass | — | Phosphoryl choline group |
| Ex. 3 | Yes | CNT | 46 | Glass | — | 1,2-dihydroxyethyl group, 1,2-dihydroxyethylene group |
| Ex. 4 | Yes | CNT | 44 | Glass | — | Polyethylene glycol chain |
| Ex. 5 | Yes | CNT | 44 | Glass | — | Polyethylene glycol chain |
| Ex. 6 | Yes | CNT | 36 | Glass | — | hydroxyethyloxy group |
| Ex. 7 | Yes | CNT | 25 | Glass | — | Polyethylene glycol chain |
| Ex. 8 | Yes | CNT | 18 | Glass | — | Polyethylene glycol chain |
| Ex. 9 | Yes | CNT | 43 | Glass | — | Polyethylene glycol chain, Polysiloxane |
| Ex. 10 | Yes | CNT | 44 | Glass | — | Crosslinked product of polyvinyl alcohol |
| Ex. 11 | Yes | CNT | 43 | Glass | — | Polyethylene glycol chain, Polysiloxane |
| Ex. 12 | Yes | CNT | 43 | Glass | — | Polyethylene glycol chain, Polysiloxane |
| Ex. 13 | Yes | CNT | 43 | Glass | — | Polyethylene glycol chain, Polysiloxane |
| Ex. 14 | Yes | CNT | 43 | Glass | — | Polyethylene glycol chain, Polysiloxane |
| Ex. 15 | Yes | CNT | 43 | Glass | — | Polyethylene glycol chain, Polysiloxane |
| Ex. 16 | Yes | Polythiophene | 43 | Glass | — | Polyethylene glycol chain, Polysiloxane |
| Ex. 17 | Yes | Graphene | 43 | Glass | — | Polyethylene glycol chain, Polysiloxane |
| Comp. Ex. 1 | No | CNT | — | Glass | 40 | — |
| Comp. Ex. 2 | Yes | CNT | 67 | Glass | — | Polysiloxane |
| Comp. Ex. 3 | No | CNT | — | Glass | 3 | — |

| | Purity of semiconductor carbon nanotubes (%) | Polymer | Bio-related substance | Molar content ratio (A):(B) | Element configuration | Sensing target | Current value decrease (%) |
|---|---|---|---|---|---|---|---|
| Ex. 1 | >95 | P3HT | anti-IgE | 90:10 | FIG. 2 | IgE | 8.2 |
| Ex. 2 | >95 | P3HT | anti-IgE | 90:10 | FIG. 2 | IgE | 8.0 |
| Ex. 3 | >95 | P3HT | anti-IgE | 85:15 | FIG. 2 | IgE | 8.1 |
| Ex. 4 | >95 | P3HT | Biotin | 88:12 | FIG. 2 | Avidin | 7.9 |
| Ex. 5 | >95 | P3HT | anti-PSA | 90:10 | FIG. 2 | PSA | 8.0 |
| Ex. 6 | >95 | P3HT | anti-IgE | 80:20 | FIG. 2 | IgE | 7.5 |
| Ex. 7 | >95 | P3HT | anti-IgE | 86:14 | FIG. 2 | IgE | 7.6 |
| Ex. 8 | >95 | P3HT | anti-IgE | 88:12 | FIG. 2 | IgE | 7.4 |
| Ex. 9 | >95 | P3HT | anti-IgE | 93:7 | FIG. 2 | IgE | 8.8 |
| Ex. 10 | >95 | P3HT | anti-IgE | 95:5 | FIG. 2 | IgE | 9.0 |
| Ex. 11 | 90 | P3HT | anti-IgE | 92:8 | FIG. 2 | IgE | 7.7 |
| Ex. 12 | 80 | P3HT | anti-IgE | 92:8 | FIG. 2 | IgE | 5.2 |
| Ex. 13 | >95 | Sodium alginate | anti-IgE | 92:8 | FIG. 2 | IgE | 6.2 |
| Ex. 14 | >95 | Polystyrene sulfonic acid | anti-IgE | 93:7 | FIG. 2 | IgE | 6.3 |
| Ex. 15 | >95 | (46) | IgE aptamer | 92:8 | FIG. 2 | IgE | 8.9 |
| Ex. 16 | — | (46) | IgE aptamer | 91:9 | FIG. 2 | IgE | 1.8 |
| Ex. 17 | — | — | IgE aptamer | 92:8 | FIG. 2 | IgE | 4.0 |
| Comp. Ex. 1 | >95 | P3HT | anti-IgE | 57:43 | Not applicable | IgE | 0.2 |
| Comp. Ex. 2 | >95 | P3HT | anti-IgE | 18:82 | FIG. 2 | IgE | 0.2 |
| Comp. Ex. 3 | >95 | P3HT | anti-IgE | 78:22 | Not applicable | IgE | 0.3 |

Although the present invention has been described in detail by referring to specific embodiments, it will be apparent to those skilled in the art that various modifications and variations are possible without departing from the spirit and scope of the present invention. This application is based on a Japanese patent application (Japanese Patent Application No. 2015-158671) filed on Aug. 11, 2015, the entirety of which is incorporated herein by reference.

INDUSTRIAL APPLICABILITY

The semiconductor element of the present invention and the sensor using the same can be applied to various kinds of sensing such as chemical analysis, physical analysis, bioanalysis, and the like, and are particularly preferably used as a medical sensor or a biosensor.

DESCRIPTION OF REFERENCE NUMERALS AND SIGNS

1 ORGANIC FILM
2 FIRST ELECTRODE
3 SECOND ELECTRODE
4 SEMICONDUCTOR LAYER
5 SUBSTRATE
6 GATE ELECTRODE

The invention claimed is:

1. A semiconductor element comprising an organic film, a first electrode, a second electrode, and a semiconductor layer, in which
the first electrode, the second electrode and the semiconductor layer are formed on a surface of the organic film,
the semiconductor layer is arranged between the first electrode and the second electrode, and
an exposed portion of the organic film surface is adjacent to an exposed portion of the semiconductor layer so as to form a sensing portion,
wherein
the semiconductor layer comprises at least one member selected from an organic semiconductor, carbon nanotubes and a graphene, and
the organic film comprises a compound having a nonionic functional group or a zwitterionic functional group and has a water contact angle of 5° or more and 50° or less.

2. The semiconductor element according to claim 1, wherein the semiconductor layer comprises carbon nanotubes.

3. The semiconductor element according to claim 1, wherein the organic film has a water contact angle of 35° or more and 50° or less.

4. The semiconductor element according to claim 1, wherein the nonionic functional group or the zwitterionic functional group is at least one structure selected from a polyethylene glycol chain, a phosphorylcholine group, a 1,2-dihydroxyethyl group, a 1,2-dihydroxyethylene group, and a hydroxyethyloxy group.

5. The semiconductor element according to claim 1, wherein the organic film comprises a polysiloxane.

6. The semiconductor element according to claim 1, wherein the compound is a polysiloxane.

7. The semiconductor element according to claim 1, wherein the organic film comprises a cross-linked polymer.

8. The semiconductor element according to claim 1, wherein the compound is a cross-linked polymer.

9. The semiconductor element according to claim 7, wherein the cross-linked polymer comprises a hydroxy group.

10. The semiconductor element according to claim 7, wherein the cross-linked polymer comprises a cross-linked product of polyvinyl alcohol.

11. The semiconductor element according to claim 2, wherein the carbon nanotube comprises 90% by weight or more of a semiconductor type carbon nanotube.

12. The semiconductor element according to claim 2, wherein the carbon nanotube is a carbon nanotube composite having a polymer adhering on at least a part of a surface thereof.

13. The semiconductor element according to claim 12, wherein the polymer is a conjugated polymer.

14. The semiconductor element according to claim 1, comprising, on at least a part of the semiconductor layer, a bio-related substance that selectively interacts with a substance to be sensed.

15. The semiconductor element according to claim 14, wherein the bio-related substance is a protein or an oligonucleotide.

16. The semiconductor element according to claim 14, wherein the bio-related substance is an antibody or an aptamer.

17. The semiconductor element according to claim 14, having a ratio of a molar content A of the bio-related substance contained in the semiconductor layer and a molar content B of the bio-related substance contained in the organic film being (A):(B)=80:20 to 100:0.

18. A method for manufacturing the semiconductor element described in claim 1, comprising a step of coating and drying a solution comprising a carbon nanotube to form the semiconductor layer.

19. A sensor comprising the semiconductor element described in claim 1.

20. The semiconductor element according to claim 1, wherein the organic film is formed of at least one silane coupling agent selected from the group consisting of a silane coupling agent containing a polyethylene glycol chain, a silane coupling agent containing a phosphorylcholine group, a silane coupling agent containing a 1,2-dihydroxyethyl group, a silane coupling agent containing a 1,2-dihydroxyethylene group, and a silane coupling agent containing a hydroxyethyloxy group, is formed of at least one polymer selected from the group consisting of a polymer having a polyethylene glycol chain in a side chain, a polymer having a phosphorylcholine group in a side chain, a polymer having a 1,2-dihydroxyethyl group in a side chain, and a polymer having a hydroxyethyloxy group in a side chain, or contains a cross-linked polymer.

21. The semiconductor element according to claim 1,
wherein the nonionic functional group or the zwitterionic functional group is at least one structure selected from the group consisting of a polyethylene glycol chain, a phosphorylcholine group, a 1,2-dihydroxyethyl group, a 1,2-dihydroxyethylene group, and a hydroxyethyloxy group.

* * * * *